(12) United States Patent
Iwano et al.

(10) Patent No.: US 9,039,796 B2
(45) Date of Patent: May 26, 2015

(54) METHOD FOR PRODUCING ABRASIVE GRAINS, METHOD FOR PRODUCING SLURRY, AND METHOD FOR PRODUCING POLISHING LIQUID

(75) Inventors: Tomohiro Iwano, Hitachi (JP); Hisataka Minami, Hitachi (JP); Hirotaka Akimoto, Hitachinaka (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

(21) Appl. No.: 13/582,961

(22) PCT Filed: Nov. 21, 2011

(86) PCT No.: PCT/JP2011/076830
§ 371 (c)(1),
(2), (4) Date: Sep. 5, 2012

(87) PCT Pub. No.: WO2012/070544
PCT Pub. Date: May 31, 2012

(65) Prior Publication Data
US 2012/0324800 A1      Dec. 27, 2012

(30) Foreign Application Priority Data

Nov. 22, 2010  (JP) ................ P2010-260036
Nov. 22, 2010  (JP) ................ P2010-260039
Aug. 22, 2011  (JP) ................ P2011-180667

(51) Int. Cl.
| | | |
|---|---|---|
| B24D 3/00 | (2006.01) | |
| B24D 11/00 | (2006.01) | |
| C09K 3/14 | (2006.01) | |
| C09G 1/02 | (2006.01) | |
| H01L 21/3105 | (2006.01) | |
| C09K 13/00 | (2006.01) | |

(52) U.S. Cl.
CPC ............. *C09G 1/02* (2013.01); *C09K 3/1463* (2013.01); *H01L 21/31053* (2013.01); *C09K 13/00* (2013.01); *C09K 3/1409* (2013.01)

(58) Field of Classification Search
None
See application file for complete search history.

(56) References Cited

U.S. PATENT DOCUMENTS

| | | | | |
|---|---|---|---|---|
| 3,097,083 A | * | 7/1963 | Silvernail | ................. 51/307 |
| 3,123,452 A | * | 3/1964 | Harris | ..................... 51/307 |
| 5,529,969 A | * | 6/1996 | Bonneau et al. | ........... 502/263 |

(Continued)

FOREIGN PATENT DOCUMENTS

| | | |
|---|---|---|
| CN | 1457506 | 11/2003 |
| CN | 1524917 | 9/2004 |

(Continued)

OTHER PUBLICATIONS

English translation of PCT/ISA/237 in connection with No. PCT/JP2011/076830, 5 pages.

(Continued)

*Primary Examiner* — Kaj K Olsen
*Assistant Examiner* — Ross J Christie
(74) *Attorney, Agent, or Firm* — Antonelli, Terry, Stout & Kraus, LLP

(57) ABSTRACT

In the production method for abrasive grains according to the invention, an aqueous solution of a salt of a tetravalent metal element is mixed with an alkali solution, under conditions such that a prescribed parameter is 5.00 or greater, to obtain abrasive grains including a hydroxide of the tetravalent metal element.

19 Claims, 7 Drawing Sheets

(56) References Cited

U.S. PATENT DOCUMENTS

| | | | |
|---|---|---|---|
| 5,908,800 A * | 6/1999 | Bonneau et al. | 501/103 |
| 6,420,269 B2 * | 7/2002 | Matsuzawa et al. | 51/307 |
| 6,440,856 B1 | 8/2002 | Bessho et al. | |
| 6,589,496 B1 * | 7/2003 | Yabe et al. | 423/263 |
| 6,786,945 B2 | 9/2004 | Machii et al. | |
| 2002/0016060 A1 | 2/2002 | Matsuzawa et al. | |
| 2004/0065022 A1 * | 4/2004 | Machii et al. | 51/309 |
| 2005/0028450 A1 | 2/2005 | Xu | |
| 2005/0074384 A1 * | 4/2005 | Yabe et al. | 423/263 |
| 2005/0255693 A1 | 11/2005 | Liu et al. | |
| 2006/0278614 A1 | 12/2006 | Wang et al. | |
| 2006/0289826 A1 | 12/2006 | Koyama et al. | |
| 2007/0166216 A1 | 7/2007 | Chinone et al. | |
| 2007/0251270 A1 | 11/2007 | Miyatani et al. | |
| 2009/0318063 A1 | 12/2009 | Misra | |
| 2010/0107509 A1 | 5/2010 | Guiselin | |
| 2011/0006251 A1 * | 1/2011 | Chinone et al. | 252/79.1 |
| 2011/0275217 A1 * | 11/2011 | Satou et al. | 438/693 |
| 2011/0275285 A1 * | 11/2011 | Satou et al. | 51/309 |
| 2012/0299158 A1 | 11/2012 | Shinoda et al. | |

FOREIGN PATENT DOCUMENTS

| | | | | |
|---|---|---|---|---|
| CN | 1746255 | | 3/2006 | |
| CN | 101395097 | | 3/2009 | |
| CN | 101649182 | | 2/2010 | |
| EP | 541158 A1 * | 5/1993 | | C01F 17/00 |
| EP | 1 369 906 | | 12/2003 | |
| EP | 1 369 906 A1 | | 12/2003 | |
| JP | 8-22970 | | 1/1996 | |
| JP | 10-106994 | | 4/1998 | |
| JP | 2002-241739 | | 8/2002 | |
| JP | 2004-155913 | | 6/2004 | |
| JP | 2006-249129 | | 9/2006 | |
| JP | 2009-010402 A | | 1/2009 | |
| JP | 2009-290188 | | 12/2009 | |
| JP | 2010-141288 | | 6/2010 | |
| JP | 2010-153781 | | 7/2010 | |
| JP | 2010-158747 | | 7/2010 | |
| WO | WO 02/067309 A1 | | 8/2002 | |
| WO | WO 2009/131133 | | 10/2009 | |
| WO | WO 2010/067844 | | 6/2010 | |
| WO | WO 2011/071168 | | 6/2011 | |
| WO | WO 2011/111421 A1 | | 9/2011 | |

OTHER PUBLICATIONS

Japanese claims from PCT/JP2011/076830 (published in WO 2012/070544), 2 pages.
Certified English translation of claims from PCT/JP2011/076830, 4 pages.
U.S. Office Action mailed Sep. 17, 2013, for U.S. Appl. No. 13/582,969.
U.S. Office Action mailed Apr. 16, 2013, for U.S. Appl. No. 13/582,969.
Transmittal of the International Preliminary Report on Patentability (Chapter I or Chapter II) dated Jun. 20, 2013, for International Application No. PCT/JP2011/076822.
Transmittal of the International Preliminary Report on Patentability (Chapter I or Chapter II) dated Jun. 20, 2013, for International Application No. PCT/JP2011/076827.
Transmittal of the International Preliminary Report on Patentability (Chapter I or Chapter II) dated Jun. 20, 2013, for International Application No. PCT/JP2011/076830.
U.S. Office Action mailed May 30, 2013, in connection with U.S. Appl. No. 13/582,972, 72 pages; U.S. Patent and Trademark Office; Alexandria, Virginia; USA.
U.S. Office Action mailed Dec. 11, 2013, for U.S. Appl. No. 13/582,972.
D. A. Skoog, et al., "Chapter 22, An Introduction to Spectrochemical Methods" *Fundamentals of Analytical Chemistry*, Seventh Edition, 1996, pp. 502-519.
U.S. Office Action mailed May 20, 2014, in connection with U.S. Appl. No. 13/756,456.
Chinese Official Action dated Jul. 10, 2014, for CN Application No. 201310335723.2.
U.S Office Action dated Oct. 9, 2014, for U.S. Appl. No. 13/582,969.
Taiwanese Official Action dated Dec. 2, 2014, for TW Application No. 102110935.

* cited by examiner

METHOD FOR PRODUCING ABRASIVE GRAINS, METHOD FOR PRODUCING SLURRY, AND METHOD FOR PRODUCING POLISHING LIQUID

TECHNICAL FIELD

The invention relates to a production method for abrasive grains, a production method for a slurry, and a production method for a polishing liquid. The invention further relates to a production method for abrasive grains to be used in substrate surface flattening steps, especially flattening steps for Shallow Trench Isolation insulating films, premetal dielectric layers and interlayer dielectric films, in semiconductor element manufacturing technology, to a production method for a slurry comprising the abrasive grains, and to a production method for a polishing liquid comprising the abrasive grains.

BACKGROUND ART

In recent years, machining techniques for increasing density and micronization are becoming ever more important in manufacturing steps for semiconductor elements. One such machining technique, CMP (chemical mechanical polishing), has become an essential technique in manufacturing steps for semiconductor elements, for formation of Shallow Trench Isolation (hereunder also referred to as "STI"), flattening of premetal dielectric layers and interlayer dielectric films, and formation of plugs and embedded metal wirings.

Fumed silica-based polishing liquids are commonly used in CMP during conventional manufacturing steps for semiconductor elements, in order to flatten the insulating films such as silicon oxide films that are formed by methods such as CVD (Chemical Vapor Deposition) or spin coating methods. Fumed silica-based polishing liquids are produced by conducting grain growth of abrasive grains by methods such as thermal decomposition with silicon tetrachloride, and adjusting the pH. However, such silica-based polishing liquids have the technical problem of low polishing rate.

Incidentally, STI is used for device isolation on integrated circuits in generation devices starting from design rules of 0.25 μm. In STI formation, CMP is used to remove excess silicon oxide films after formation on substrates. In order to halt polishing in CMP, a stopper film with a slow polishing rate is formed under the silicon oxide film. A silicon nitride film or polysilicon film is used for the stopper film, preferably with a high polishing selective ratio of the silicon oxide film with respect to the stopper film (polishing rate ratio: polishing rate on silicon oxide film/polishing rate on stopper film). A silica-based polishing liquid such as a conventional colloidal silica-based polishing liquid has a low polishing selective ratio of about 3 for the silicon oxide film with respect to the stopper film, and it tends not to have properties that can withstand practical use for STI.

On the other hand, cerium oxide-based polishing liquids comprising cerium oxide particles as abrasive grains are used as polishing liquids for glass surfaces such as photomasks or lenses. Cerium oxide-based polishing liquids have the advantage of faster polishing rate compared to silica-based polishing liquids comprising silica particles as the abrasive grains, or alumina-based polishing liquids comprising alumina particles as the abrasive grains. In recent years, polishing liquids for semiconductors, employing high-purity cerium oxide particles, have come to be used as cerium oxide-based polishing liquids (see Patent document 1, for example).

A variety of properties are required for polishing liquids such as cerium oxide-based polishing liquids. For example, it is required to increase the dispersibility of the abrasive grains such as cerium oxide particles, and to accomplish flat polishing of substrates with irregularities. Using STI as an example, there is a demand for improving polishing selective ratios for inorganic insulating films (such as silicon oxide films) as films to be polished, with respect to the polishing rates for stopper films (such as silicon nitride films or polysilicon films). Additives are often added to polishing liquids to meet this demand. For example, there is known addition of additives to polishing liquids containing cerium oxide-based particles, to control the polishing rates of the polishing liquids and improve the global flatness (see Patent document 2, for example).

Incidentally, as demand increases for achieving greater micronization of wirings in recent manufacturing steps for semiconductor elements, scratches formed during polishing are becoming problematic. Specifically, when polishing using conventional cerium oxide-based polishing liquids, fine scratches have not posed problems so long as the sizes of the scratches are smaller than conventional wiring widths, but they can be problematic when it is attempted to achieve greater micronization of wirings.

A solution to this problem is being sought through studying polishing liquids that employ particles of tetravalent metal element hydroxides (see Patent document 3, for example). Methods for producing particles of tetravalent metal element hydroxides are also being studied (see Patent document 4, for example). Such techniques are aimed at reducing particle-induced scratches, by maintaining the chemical action of the tetravalent metal element hydroxide particles while minimizing their mechanical action.

CITATION LIST

Patent Literature

[Patent document 1] Japanese Unexamined Patent Application Publication HEI No. 10-106994
[Patent document 2] Japanese Unexamined Patent Application Publication HEI No. 08-022970
[Patent Document 3] International Patent Publication No. WO02/067309
[Patent document 4] Japanese Unexamined Patent Application Publication No. 2006-249129

SUMMARY OF INVENTION

Technical Problem

The techniques described in Patent documents 3 and 4, however, cannot be said to provide sufficiently high polishing rate, despite reduction in scratches. Since polishing rate directly affects the efficiency of the production process, polishing liquids with higher polishing rates are desired.

When an additive is added to the polishing liquid, the effect obtained by adding the additive is often offset by reduced polishing rate, and it has been difficult to achieve polishing rate together with additional polishing properties.

The present invention is directed toward solving this problem, and it is an object thereof to provide a production method for abrasive grains that allow polishing of films at superior polishing rate compared to conventional abrasive grains, regardless of the presence or absence of additives that may be used together with the abrasive grains as constituent components of the polishing liquid. It is another object of the invention to provide a production method for a slurry comprising abrasive grains obtained by the aforementioned production method, and a production method for a polishing liquid comprising the abrasive grains and an additive.

Solution to Problem

As a result of diligent research on abrasive grains including tetravalent metal element hydroxides, the present inventors have found that polishing of a film can be accomplished at high rate compared to conventional abrasive grains, when using abrasive grains obtained by mixing an aqueous solution of a tetravalent metal element salt with an alkali solution in such a manner that specific conditions are satisfied. The present inventors have also found that when a slurry comprising such abrasive grains is used, it is possible to accomplish polishing of films at superior polishing rate compared to conventional polishing liquids, and have further found that when using a polishing liquid having a composition with additives added to such a slurry, it is possible to accomplish polishing of films at superior polishing rate compared to conventional polishing liquids, while maintaining the effects of the added additives.

Specifically, in the production method for abrasive grains according to the invention, a first liquid which is an aqueous solution of a salt of a tetravalent metal element is mixed with a second liquid which is an alkali solution, under conditions such that parameter Z in the following formula (1) is 5.00 or greater, to yield abrasive grains including a hydroxide of a tetravalent metal element.

$$Z = [1/(\Delta pH \times k)] \times (N/M)/1000 \quad (1)$$

[In formula (1), $\Delta pH$ represents the variation in pH per minute in the reaction system, k represents the reaction temperature coefficient represented by the following formula (2), N represents the cycle count (min$^{-1}$) represented by the following formula (3), and M represents the substitution count (min$^{-1}$) represented by the following formula (5).]

$$k = 2^{[(T-20)/10]} \quad (2)$$

[In formula (2), T represents the temperature (° C.) of the reaction system.]

$$N = (u \times S)/Q \quad (3)$$

[In formula (3), u represents the linear speed (m/min) represented by the following formula (4), for a stirring blade stirring the liquid mixture obtained by mixing the first liquid and the second liquid, S represents the area (m$^2$) of the stirring blade, and Q represents the liquid volume (m$^3$) of the liquid mixture.]

$$u = 2\pi \times R \times r \quad (4)$$

[In formula (4), R represents the rotational speed (min$^{-1}$) of the stirring blade, and r represents the radius of rotation (m) of the stirring blade.]

$$M = v/Q \quad (5)$$

[In formula (5), v represents the mixing rate (m$^3$/min) of the first liquid and second liquid, and Q represents the liquid volume (m$^3$) of the liquid mixture.]

By using a slurry comprising abrasive grains obtained by this production method, it is possible to accomplish polishing of films at superior polishing rate compared to conventional abrasive grains. In addition, when using a polishing liquid having a composition with additives added to the aforementioned slurry, it is possible to accomplish polishing of films at superior polishing rate while maintaining the effects of adding the additives. According to the invention, it is also possible to inhibit formation of scratches.

The present inventors have further found that increasing the value of parameter Z improves the transparency of a solution having the obtained abrasive grains dispersed in water (hereunder referred to as "aqueous dispersion"), and that greater transparency allows polishing of films to be accomplished at superior polishing rate compared to conventional abrasive grains. Specifically, the present inventors found that with a parameter Z value of 5.00 or greater, the obtained abrasive grains include a tetravalent metal element hydroxide and produce light transmittance of 50%/cm or greater for light with a wavelength of 500 nm in an aqueous dispersion with a content of the abrasive grains adjusted to 1.0 mass %, and further found that using a slurry or polishing liquid comprising such abrasive grains allows polishing of films at superior polishing rate.

In addition, the present inventors found that further increasing the parameter Z value results in yellow coloration of the aqueous dispersion, with a deeper color being exhibited as the parameter Z value increases, and also found that it is possible to accomplish polishing of films at even more superior polishing rate as the color is deeper.

Specifically, the present inventors found that with a large parameter Z value, the obtained abrasive grains produce absorbance of 1.50 or greater for light with a wavelength of 400 nm in an aqueous dispersion with a content of the abrasive grains adjusted to 1.0 mass % while maintaining the aforementioned light transmittance of 50%/cm or greater, and further found that using a slurry or polishing liquid comprising such abrasive grains allows polishing of films at an even more superior polishing rate.

In addition, the present inventors found that with a large parameter Z value, the obtained abrasive grains produce absorbance of at least 1.000 for light with a wavelength of 290 nm in an aqueous dispersion with a content of the abrasive grains adjusted to 0.0065 mass % (65 ppm) while maintaining the aforementioned light transmittance of 50%/cm or greater, and further found that using a slurry or polishing liquid comprising such abrasive grains allows polishing of films at an even more superior polishing rate. Here, "ppm" represents ppm by weight, or "parts per million weight".

In the production method for abrasive grains of the invention, the $\Delta pH$ is preferably not greater than 5.00. This will yield abrasive grains that allow polishing of films at an even more superior polishing rate.

The cycle count N is preferably 1.00 min$^{-1}$ or greater. This will yield abrasive grains that allow polishing of films at an even more superior polishing rate.

The substitution count M is preferably not greater than 1.0 min$^{-1}$. This will yield abrasive grains that allow polishing of films at an even more superior polishing rate.

The linear speed u is preferably 5.00 m/min or greater. This will yield abrasive grains that allow polishing of films at an even more superior polishing rate.

The mixing rate v is preferably not greater than $1.00 \times 10^{-2}$ m$^3$/min. This will yield abrasive grains that allow polishing of films at an even more superior polishing rate.

The rotational speed R of the stirring blade is preferably 30 min$^{-1}$ or greater. This will yield abrasive grains that allow polishing of films at an even more superior polishing rate.

The temperature T of the reaction system is preferably not higher than 60° C. This will yield abrasive grains that allow polishing of films at an even more superior polishing rate.

The concentration of the salt of the tetravalent metal element in the first liquid is preferably at least 0.01 mol/L (where L stands for "liter", same hereunder). This will yield abrasive grains that allow polishing of films at an even more superior polishing rate.

The alkaline concentration of the second liquid is preferably not greater than 15.0 mol/L. This will yield abrasive grains that allow polishing of films at an even more superior polishing rate.

The pH of the liquid mixture is preferably 2.0 to 7.0. This will yield abrasive grains that allow polishing of films at an even more superior polishing rate.

The tetravalent metal element is preferably tetravalent cerium. This will yield abrasive grains that allow polishing of films at an even more superior polishing rate.

In the production method for a slurry according to the invention, abrasive grains obtained by the production method for abrasive grains described above are mixed with water to obtain a slurry. By using a slurry obtained by this production method, it is possible to accomplish polishing of films at superior polishing rate compared to a conventional polishing liquid.

Also, the production method for a polishing liquid according to the invention may be one in which a slurry obtained by the production method for a slurry described above is mixed with an additive to obtain a polishing liquid. The production method for a polishing liquid according to the invention may also be one in which abrasive grains obtained by the production method for abrasive grains described above, an additive and water are mixed to obtain a polishing liquid. By using a polishing liquid obtained by these production methods, it is possible to accomplish polishing of films at a superior polishing rate compared to conventional polishing liquids, while maintaining the effects of adding additives.

Advantageous Effects of Invention

According to the invention, it is possible to provide abrasive grains and a slurry that allow polishing of films at a superior polishing rate compared to the prior art. Moreover, according to the invention, it is possible to provide a polishing liquid (CMP polishing solution) that allows polishing of films at a superior polishing rate compared to conventional polishing liquids, while maintaining the effects of adding additives.

DESCRIPTION OF EMBODIMENTS

Figure 1:
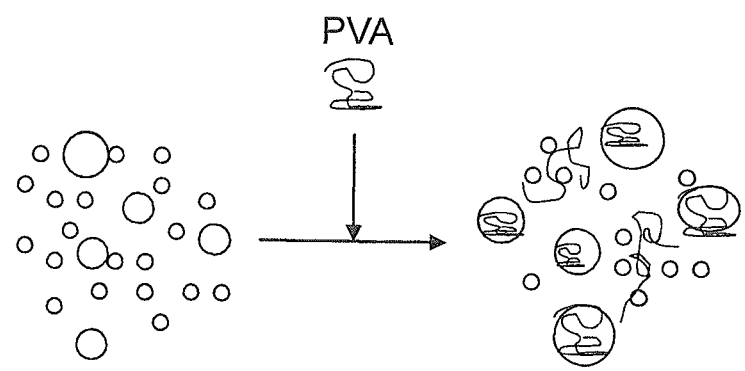
FIG. 1 is a schematic diagram showing the aggregated condition of abrasive grains when an additive has been added.

Embodiments of the invention will now be described in detail. The invention is not limited to the described embodiments, and may be carried out with various modifications such as are within the scope of the gist thereof. The "slurry" and "polishing liquid", for the purpose of the invention, are the composition that contacts the film to be polished during polishing, and they comprise at least water and abrasive grains. Also, an aqueous dispersion with a content of the abrasive grains adjusted to a prescribed value is a solution comprising the prescribed amount of abrasive grains and water.

<Granulation of Abrasive Grains>

The abrasive grains of this embodiment include a tetravalent metal element hydroxide and are granulated under specific conditions. Abrasive grains including a tetravalent metal element hydroxide are formed by mixing a metal salt aqueous solution (first liquid) of a salt of a tetravalent metal element (metal salt), with an alkali solution (second liquid). This will allow particles with extremely fine particle sizes to be obtained, so that abrasive grains with an excellent effect of reducing scratches can be obtained. A method for obtaining abrasive grains including a tetravalent metal element hydroxide is disclosed in Patent document 4, for example. Examples of tetravalent metal element salts, where M is the metal, include $M(SO_4)_2$, $M(NH_4)_2(NO_3)_6$ and $M(NH_4)_4(SO_4)_4$. Such salts may be used as a single type alone or in combinations of two or more types.

From the viewpoint of a gentler rise in pH, the metal salt concentration of the tetravalent metal element salt in the metal salt aqueous solution is preferably 0.010 mol/L or greater, more preferably 0.020 mol/L or greater and even more preferably 0.030 mol/L or greater, based on the total metal salt aqueous solution. There is no particular restriction on the upper limit for the metal salt concentration of the tetravalent metal element salt, but for easier manageability, it is preferably not greater than 1.000 mol/L based on the total metal salt aqueous solution.

The alkali (base) of the alkali solution (such as an aqueous alkali solution) is not particularly restricted, but specific examples include organic bases such as ammonia, triethylamine, pyridine, piperidine, pyrrolidine, imidazole and chitosan and inorganic bases such as potassium hydroxide and sodium hydroxide. Such bases may be used as a single type alone or in combinations of two or more types.

From the viewpoint of further inhibiting rapid reaction and increasing the absorbance for light with a wavelength of 400 nm and with a wavelength of 290 nm, explained hereunder, the alkali solution preferably exhibits weak basicity. Of the bases mentioned above, nitrogen-containing heterocyclic organic bases are preferred, pyridine, piperidine, pyrrolidine and imidazole are more preferred, and pyridine and imidazole are even more preferred.

From the viewpoint of a gentler rise in pH, the alkaline concentration of the alkali solution is preferably not greater than 15.0 mol/L, more preferably not greater than 12.0 mol/L and even more preferably not greater than 10.0 mol/L, based on the total alkali solution. There is no particular restriction on the lower limit for the alkali solution, but from the viewpoint of productivity, it is preferably at least 0.001 mol/L based on the total alkali solution.

The alkaline concentration of the alkali solution is preferably adjusted as appropriate depending on the type of alkali selected. For example, for an alkali with a pKa in the range of 20 or greater, the alkaline concentration is preferably not greater than 0.1 mol/L, more preferably not greater than 0.05 mol/L and even more preferably not greater than 0.01 mol/L based on the total alkali solution, from the viewpoint of a gentler rise in pH. There is no particular restriction on the lower limit for the alkali solution, but from the viewpoint of productivity, it is preferably at least 0.001 mol/L based on the total alkali solution.

For an alkali with a pKa in the range of 12 or greater and less than 20, the alkaline concentration is preferably not greater than 1.0 mol/L, more preferably not greater than 0.5 mol/L and even more preferably not greater than 0.1 mol/L based on the total alkali solution, from the viewpoint of a gentler rise in pH. There is no particular restriction on the lower limit for the alkali solution, but from the viewpoint of productivity, it is preferably at least 0.01 mol/L based on the total alkali solution.

For an alkali with a pKa in the range of less than 12, the alkaline concentration is preferably not greater than 15.0 mol/L, more preferably not greater than 10.0 mol/L and even more preferably not greater than 5.0 mol/L based on the total alkali solution, from the viewpoint of a gentler rise in pH. There is no particular restriction on the lower limit for the alkali solution, but from the viewpoint of productivity, it is preferably at least 0.1 mol/L based on the total alkali solution.

Specific examples of alkalis with pKa values in these ranges include 1,8-diazabicyclo[5.4.0]undec-7-ene (pKa: 25) as an alkali with a pKa of 20 or greater, potassium hydroxide (pKa: 16) and sodium hydroxide (pKa: 13) as alkalis with a pKa of 12 or greater and less than 20, and ammonia (pKa: 9) and imidazole (pKa: 7) as alkalis with a pKa of less than 12. The pKa value of the alkali used is restricted by adjustment to an appropriate concentration, without being particularly limited thereto.

The absorbance for light with a wavelength of 400 nm or with a wavelength of 290 nm, and the light transmittance for light with a wavelength of 500 nm, explained hereunder, can be altered by controlling the starting concentrations of the metal salt aqueous solution and the alkali solution. Specifically, the absorbance and light transmittance tend to be higher with reduced progression of the reaction between the acid and alkali per unit time, and for example, the absorbance and light transmittance tend to be higher with increased concentration of the metal salt aqueous solution, while the absorbance and light transmittance tend to be higher with reduced concentration of the alkali solution.

The pH of the liquid mixture obtained by mixing the metal salt aqueous solution and alkali solution is preferably 2.0 or higher, more preferably 3.0 or higher and even more preferably 4.0 or higher in the stable state after mixing the metal salt aqueous solution and the alkali solution, from the viewpoint of stability of the liquid mixture. The pH of the liquid mixture is preferably not higher than 7.0, more preferably not higher than 6.5 and even more preferably not higher than 6.0 from the viewpoint of stability of the liquid mixture.

The pH of the liquid mixture can be measured with a pH meter (for example, a Model PH81 by Yokogawa Electric Corp.). The pH is measured by placing an electrode in the liquid to be measured after 2-point calibration using standard buffer (phthalate pH buffer: pH 4.01 (25° C.), neutral phosphate pH buffer: pH 6.86 (25° C.)), and then measuring the value upon stabilization after an elapse of 2 minutes or more.

The abrasive grains including the tetravalent metal element hydroxide are obtained by mixing the metal salt aqueous solution and the alkali solution under conditions such that parameter Z represented by following formula (1) is 5.00 or greater, to react the tetravalent metal element salt of the metal salt aqueous solution with the base of the alkali solution. During mixing of the both liquids, the liquid mixture obtained by mixing the metal salt aqueous solution and the alkali solution is stirred using a stirring blade that rotates on a rotating shaft.

$$Z=[1/(\Delta pH \times k)] \times (N/M)/1000 \quad (1)$$

[In formula (1), $\Delta$pH represents the variation in pH per minute in the reaction system, k represents the reaction temperature coefficient represented by the following formula (2), N represents the cycle count (min$^{-1}$) represented by the following formula (3), and M represents the substitution count (min$^{-1}$) represented by the following formula (5).]

$$k=2^{[(T-20)/10]} \quad (2)$$

[In formula (2), T represents the temperature (° C.) of the reaction system.]

$$N=(u \times S)/Q \quad (3)$$

[In formula (3), u represents the linear speed (m/min) represented by the following formula (4), for a stirring blade stirring the liquid mixture obtained by mixing the metal salt aqueous solution and the alkali solution, S represents the area (m$^2$) of the stirring blade, and Q represents the liquid volume (m$^3$) of the liquid mixture.]

$$u=2\pi \times R \times r \quad (4)$$

[In formula (4), R represents the rotational speed (min$^{-1}$) of the stirring blade, and r represents the radius of rotation (m) of the stirring blade.]

$$M=v/Q \quad (5)$$

[In formula (5), v represents the mixing rate (m$^3$/min) of the metal salt aqueous solution and the alkali solution, and Q represents the liquid volume (m$^3$) of the liquid mixture.]

Abrasive grains obtained by this production method can satisfy condition (a) below while also satisfying either or both of condition (b) and condition (c).

(a) The abrasive grains produce light transmittance of 50%/cm or greater for light with a wavelength of 500 nm in an aqueous dispersion with a content of the abrasive grains adjusted to 1.0 mass %.

(b) The abrasive grains produce absorbance of 1.50 or greater for light with a wavelength of 400 nm in an aqueous dispersion with a content of the abrasive grains adjusted to 1.0 mass %.

(c) The abrasive grains produce absorbance of 1.000 or greater for light with a wavelength of 290 nm in an aqueous dispersion with a content of the abrasive grains adjusted to 0.0065 mass % (65 ppm).

The present inventors have found that by using abrasive grains that satisfy condition (a) of producing light transmittance of 50%/cm or greater for light with a wavelength of 500 nm, while also satisfying either or both condition (b) relating to absorbance for light with a wavelength of 290 nm and/or condition (c) relating to absorbance for light with a wavelength of 400 nm, it is possible to accomplish polishing of films at superior polishing rate compared to the prior art, and have also found a production method for abrasive grains exhibiting such properties. The present inventors further found that a polishing liquid and slurry satisfying these conditions have a slight yellowish tint as observed visually, and that a greater degree of yellowishness of the polishing liquid and slurry is linked to improved polishing rate.

(Parameter Z)

Based on study, the present inventors have found that abrasive grains that allow polishing of films at superior polishing rate can be obtained by promoting moderate and uniform reaction between a metal salt aqueous solution and an alkali solution during production of the abrasive grains. On the basis of this knowledge, the present inventors found that it is possible to produce abrasive grains that allow polishing of films at superior polishing rate compared to the prior art, by controlling parameter Z which is set by the prescribed parameters of formula (1). Specifically, such abrasive grains can be produced by adjusting each parameter of formula (1) for a large parameter Z.

The present inventors set parameter Z of formula (1) based on this knowledge. The components of formula (1) will be considered in the following two separate parts for explanation of formula (1).

$$[1/(\Delta pH \times k)] \quad (a):$$

$$(N/M) \quad (b):$$

Component (a) is set as the index relating primarily to reactivity in the synthesis. As a result of studying each parameter, it is conjectured that a small value is preferred for ΔpH, which is the variation in pH per unit time (1 minute) in the reaction system, with a smaller ΔpH resulting in more moderate progress of the reaction. Therefore, ΔpH was set to be in the denominator in formula (1).

Based on study, the present inventors also found that a low reaction system temperature T is preferred, and that a small reaction temperature coefficient k, represented by formula (2), is preferred. A smaller reaction temperature coefficient k, i.e. a lower temperature T, is conjectured to result in more moderate progress of the reaction. Therefore, k was set to be in the denominator in formula (1).

On the other hand, component (b) was set as an index relating primarily to reactivity in the synthesis and diffusibility of the solution. The cycle count N is dependent on the linear speed u of the stirring blade, the area S of the stirring blade that stirs the liquid mixture and the liquid volume Q of the liquid mixture, in formula (3), while the linear speed u is dependent on the rotational speed R of the stirring blade and the radius of rotation r in formula (4). The cycle count N is an index representing the degree of the speed of diffusion when two or more substances are mixed. As a result of study, it is conjectured that a large cycle count N is preferred, with a larger cycle count N resulting in more uniform mixture of the metal salt aqueous solution and alkali solution, and more uniform progression of the reaction. Therefore, N was set to be in the numerator in formula (1).

Also, the substitution count M is dependent on the mixing rate v and the liquid volume Q of the liquid mixture in formula (5). The substitution count M is an index representing the rate of substitution of a substance A to a different substance B, when substance A and substance B are mixed. As a result of study, it is conjectured that a small substitution count M is preferred, with a smaller substitution count M resulting in more moderate progression of the reaction. Therefore, M was set to be in the denominator in formula (1).

It is thought that the parameters set by (a) and (b) contribute together rather than individually to the reactivity of production reaction of the tetravalent metal element hydroxide, and to the diffusibility of the reactants. Since they are considered to act synergistically instead of merely additively, the product of (a) and (b) are represented in formula (1). Finally, the product of (a) and (b) is divided by 1000 for convenience to yield formula (1) as parameter Z.

The lower limit for parameter Z is 5.00 or greater, preferably 10.00 or greater, more preferably 20.00 or greater, even more preferably 30.00 or greater, especially more preferably 50.00 or greater and extremely preferably 100.00 or greater, from the viewpoint of obtaining abrasive grains that allow polishing of films at superior polishing rate compared to conventional abrasive grains. The upper limit for parameter Z is not particularly restricted, but is preferably not greater than 5000.00 from the viewpoint of productivity.

By controlling each parameter in formula (1), it is possible to adjust parameter Z to a prescribed value. Each parameter used to adjust parameter Z will now be explained in further detail.

(Variation in pH: ΔpH)

The variation in pH is the average value of the change in pH per unit time (1 minute) from the start of mixing of the metal salt aqueous solution and alkali solution until the pH of the liquid mixture stabilizes to a constant pH. By controlling ΔpH, which is the variation in pH per unit time (hereunder referred to simply as "ΔpH"), it is possible to increase the value of parameter Z. Specifically, minimizing ΔpH tends to increase the value of parameter Z. The specific means for achieving this may be increasing the metal salt concentration of the metal salt aqueous solution, lowering the alkaline concentration of the alkali solution, or using a weak base as the base for the alkali solution.

The upper limit for ΔpH is preferably not greater than 5.00, more preferably not greater than 1.00, even more preferably not greater than 0.50 and especially preferably not greater than 0.10, per unit time, from the viewpoint of further preventing rapid reaction. The lower limit for ΔpH is not particularly restricted, but from the viewpoint of productivity, it is preferably at least 0.001 per unit time.

(Reaction Temperature: T)

By controlling the reaction temperature for synthesis (the temperature of the reaction system, the synthesis temperature) T, it is possible to increase parameter Z. Specifically, lowering the reaction temperature T, i.e. reducing the reaction temperature coefficient k, tends to increase the value of parameter Z.

The reaction temperature T is preferably within the range of 0-60° C., as the temperature in the reaction system read upon placing a thermometer in the reaction system (liquid mixture). The upper limit for the reaction temperature T is preferably not higher than 60° C., more preferably not higher than 50° C., even more preferably not higher than 40° C., especially preferably not higher than 30° C. and especially preferably not higher than 25° C., from the viewpoint of further preventing rapid reaction. From the viewpoint of facilitating progression of the reaction, the lower limit for the reaction temperature T is preferably 0° C. or higher, more preferably 5° C. or higher, even more preferably 10° C. or higher, especially more preferably 15° C. or higher and extremely preferably 20° C. or higher.

The tetravalent metal element salt in the metal salt aqueous solution and the base of the alkali solution are preferably reacted at a fixed reaction temperature T (for example, in a temperature range of reaction temperature T±3° C.). The method of adjusting the reaction temperature is not particularly restricted, and for example, it may be a method in which a container holding either the metal salt aqueous solution or the alkali solution is placed in a water tank filled with water, and the metal salt aqueous solution and alkali solution are mixed while adjusting the water temperature of the water tank using a Coolnics Circulator (product name: Cooling Thermopump CTP101 by Eyela) as the external circulation apparatus.

(Cycle Count: N)

The lower limit for the cycle count N is preferably 1.00 $min^{-1}$ or greater, more preferably 10.00 $min^{-1}$ or greater and even more preferably 50.00 $min^{-1}$ or greater, from the viewpoint of further preventing local bias of the reaction. The upper limit for the cycle count N is not particularly restricted, but is preferably not greater than 200.00 $min^{-1}$ from the viewpoint of preventing splashing of liquid during production.

(Linear Speed u)

The linear speed is the flow rate of fluid per unit time (1 minute) and unit area ($m^2$), and it is an index for diffusion of a substance. The linear speed u for this embodiment is the linear speed of the stirring blade during mixing of the metal salt aqueous solution and the alkali solution. By controlling the linear speed, it is possible to increase parameter Z. Specifically, increasing the linear speed u tends to increase the value of parameter Z.

The lower limit for the linear speed u is preferably 5.00 m/min or greater, more preferably 10.00 m/min or greater, even more preferably 20.00 m/min or greater, especially more preferably 50.00 m/min or greater and extremely preferably 70.00 m/min or greater, from the viewpoint of further preventing the substance from failing to thoroughly diffuse, which results in its localization and non-uniformity of the reaction. The upper limit for the linear speed u is not particularly restricted, but is preferably not greater than 200.00 m/min from the viewpoint of preventing splashing of liquid during production.

(Area of Stirring Blade: S)

The area S of the stirring blade which stirs the liquid mixture is the surface area of one side of the stirring blade, and in the case of multiple stirring blades, it is the total area of all of the stirring blades. By controlling the area S, it is possible to increase parameter Z. Specifically, increasing the area S tends to increase the value of parameter Z.

The area S is adjusted according to the size of the liquid volume Q of the liquid mixture. For example, when the liquid volume Q of the liquid mixture is 0.001 to 0.005 $m^3$, the area S is preferably 0.0005 to 0.0010 $m^2$.

(Liquid Volume of Liquid Mixture: Q)

The liquid volume Q of the liquid mixture is the total volume of the metal salt aqueous solution and the alkali solution. In formula (1), the liquid volume Q included in the cycle count N and the liquid volume Q included in the substitution count M cancel each other out, and the parameter Z almost tends not to depend on the value of the liquid volume Q. The liquid volume Q is 0.001 to 10.00 $m^3$, for example.

(Rotational Speed of Stirring Blade: R)

By controlling the rotational speed R, it is possible to increase parameter Z. Specifically, increasing the rotational speed R tends to increase the value of parameter Z.

The lower limit for the rotational speed R is preferably 30 $min^{-1}$ or greater, more preferably 100 $min^{-1}$ or greater and even more preferably 300 $min^{-1}$ or greater, from the viewpoint of mixing efficiency. The upper limit for the rotational speed R is not particularly restricted, and it will need to be appropriately adjusted depending on the size and shape of the stirring blade, but it is preferably not greater than 1000 $min^{-1}$ from the viewpoint of preventing splashing of liquid during production.

(Radius of Rotation of Stirring Blade: R)

By controlling the radius of rotation r, it is possible to increase parameter Z. Specifically, increasing the radius of rotation r tends to increase the value of parameter Z.

The lower limit for the radius of rotation r is preferably 0.001 m or greater, more preferably 0.01 m or greater and even more preferably 0.1 m or greater, from the viewpoint of stirring efficiency. The upper limit for the radius of rotation r is not particularly restricted, but is preferably not greater than 10 m from the viewpoint of facilitating handling. In the case of multiple stirring blades, the average value of the radius of rotation is preferably within the aforementioned range.

(Substitution Count M)

By controlling the substitution count M, it is possible to increase parameter Z. Specifically, decreasing the substitution count M tends to increase the value of parameter Z.

The upper limit for the substitution count M is preferably not greater than 1.0 $min^{-1}$, more preferably not greater than $1.0 \times 10^{-1}$ $min^{-1}$, even more preferably not greater than $2.0 \times 10^{-2}$ $min^{-1}$, especially more preferably not greater than $1.0 \times 10^{-2}$ $min^{-1}$ and extremely preferably not greater than $1.0 \times 10^{-3}$ $min^{-1}$, from the viewpoint of further preventing rapid progression of the reaction. The lower limit for the substitution count M is not particularly restricted, but is preferably $1.0 \times 10^{-5}$ $min^{-1}$ or greater from the viewpoint of productivity.

(Mixing Rate: v)

The mixing rate v is the supply rate of solution A, which is either the metal salt aqueous solution or the alkali solution, when solution A is supplied to the other solution B. By controlling the mixing rate v, it is possible to increase parameter Z. Specifically, lowering the mixing rate v tends to increase the value of parameter Z.

The upper limit for the mixing rate v is preferably not greater than $1.00 \times 10^{-2}$ $m^3$/min, more preferably not greater than $1.00 \times 10^{-3}$ $m^3$/min, even more preferably not greater than $1.00 \times 10^{-4}$ $m^3$/min and especially preferably not greater than $5.00 \times 10^{-6}$ $m^3$/min, from the viewpoint of further preventing rapid progression of the reaction and further preventing local bias of the reaction. The lower limit for the mixing rate v is not particularly restricted, but is preferably $1.00 \times 10^{-7}$ $m^3$/min or greater from the viewpoint of productivity.

Abrasive grains including a tetravalent metal element hydroxide produced in the manner described above may include impurities, and the impurities may be removed. The method for removing the impurities is not particularly restricted, and for example, methods such as centrifugal separation, filter press and ultrafiltration may be mentioned. This can adjust the absorbance for light with a wavelength of 450-600 nm, explained hereunder. The reaction mixture obtained by reaction between the metal salt aqueous solution and alkali solution comprises abrasive grains including a tetravalent metal element hydroxide, and the reaction mixture may be used for polishing of a film to be polished.

<Production of Slurry>

The production method for a slurry according to this embodiment comprises an abrasive grain producing step in which a metal salt aqueous solution and an alkali solution are mixed under the aforementioned conditions to obtain the abrasive grains, and a slurry producing step in which the abrasive grains obtained by the abrasive grain producing step are mixed with water to obtain a slurry. In the slurry producing step, the abrasive grains are dispersed in water. The method of dispersing the abrasive grains in water is not particularly restricted, and specific examples include stirring, a homogenizer, an ultrasonic disperser, a wet ball mill, or the like. A slurry may also be obtained by mixing abrasive grains obtained in the abrasive grain producing step, another type of abrasive grains, and water.

<Production of Polishing Liquid>

The production method for a polishing liquid may be one comprising a slurry producing step in which a slurry is obtained by the production method for a slurry described above, and a polishing liquid preparation step in which a polishing liquid is obtained by mixing the slurry and an additive. In this case, there may be prepared a two-pack type polishing liquid separately comprising a slurry containing abrasive grains and an additive solution containing an additive, and the slurry and additive solution may be mixed to obtain a polishing liquid. The production method for a polishing liquid may also be one comprising the aforementioned abrasive grain producing step, and a polishing liquid preparation step in which a polishing liquid is obtained by mixing abrasive grains obtained in the abrasive grain producing step, an additive, and water. In this case, there may be mixed the abrasive grains obtained in the abrasive grain producing step, another type of abrasive grains, and water.

<Polishing Liquid>

The polishing liquid of this embodiment comprises at least abrasive grains, an additive and water. Each of these constituent components will now be explained.

(Abrasive Grains)

The abrasive grains include a tetravalent metal element hydroxide. The tetravalent metal element is preferably a rare earth element, and from the viewpoint of facilitating formation of a hydroxide suitable for polishing, it is more preferably at least one kind selected from the group consisting of scandium, yttrium, lanthanum, cerium, praseodymium, neodymium, promethium, gadolinium, terbium, dysprosium, holmium, erbium, thulium, ytterbium and lutetium. The tetravalent metal element is even more preferably cerium, from the viewpoint of ready availability and a more superior polishing rate.

The abrasive grains are preferably composed of a tetravalent metal element hydroxide, and from the viewpoint of high chemical activity and a more superior polishing rate, they are more preferably composed of a hydroxide of tetravalent cerium. The polishing liquid of this embodiment may also combine other types of abrasive grains, within ranges that do not impair the properties of the abrasive grains including the tetravalent metal element hydroxide. Specifically, abrasive grains of silica, alumina or zirconia, for example, may be used.

The content of the tetravalent metal element hydroxide in the abrasive grains is preferably 50 mass % or greater, more preferably 60 mass % or greater, even more preferably 70 mass % or greater, especially more preferably 80 mass % or greater and extremely preferably 90 mass % or greater, based on the total mass of the abrasive grains.

Of the constituent components of the polishing liquid of this embodiment, the tetravalent metal element hydroxide is believed to have a major effect on the polishing properties. Thus, adjusting the content of the tetravalent metal element hydroxide can improve chemical interaction between the abrasive grains and surface to be polished, and further improve the polishing rate. Specifically, the content of the tetravalent metal element hydroxide is preferably 0.01 mass % or greater, more preferably 0.05 mass % or greater and even more preferably 0.1 mass % or greater based on the total mass of the polishing liquid, from the viewpoint of helping to sufficiently exhibit the function of the tetravalent metal element hydroxide. In addition, the content of the tetravalent metal element hydroxide is preferably not greater than 8 mass % and more preferably not greater than 5 mass % based on the total mass of the polishing liquid, from the viewpoint of helping to avoid aggregation of the abrasive grains.

The abrasive grain content is not particularly restricted, but from the viewpoint of helping to avoid aggregation of the abrasive grains and allowing the abrasive grains to effectively act on the surface to be polished to smoothly promote polishing, it is preferably 0.01-10 mass % and more preferably 0.1-5 mass % based on the total mass of the polishing liquid.

The mean secondary particle size of the abrasive grains (hereunder referred to as "mean particle size", unless otherwise specified) is preferably 1-200 nm from the viewpoint of obtaining a more superior polishing rate. Since a smaller mean particle size to some extent increases the specific surface area of the abrasive grains that contact with the surface to be polished, and thus allowing the polishing rate to further improved, the mean particle size is more preferably not greater than 150 nm, even more preferably not greater than 100 nm, especially more preferably not greater than 80 nm and extremely preferably not greater than 50 nm. Since a larger mean particle size to some extent tends to facilitate increase in the polishing rate, the lower limit for the mean particle size is more preferably at least 2 nm and even more preferably at least 5 nm.

The mean particle size of the abrasive grains can be measured with a particle size distribution meter based on the photon correlation method, and specifically, it may be measured using a Zetasizer 3000HS by Malvern Instruments Ltd. or an N5 by Beckman Coulter, Inc., for example. Specifically, in a measuring method using an N5, for example, an aqueous dispersion with a content of the abrasive grains adjusted to 0.2 mass % is prepared, approximately 4 mL of the aqueous dispersion is poured into a 1 cm-square cell, and the cell is placed in the apparatus. Measurement is conducted at 25° C. with a dispersing medium refractive index of 1.33 and a viscosity of 0.887 mPa·s, and the value of the mean particle size of the abrasive grains is obtained.

[Absorbance]

It is not necessarily fully understood why an effect of improving polishing rate is obtained by using abrasive grains that produce absorbance of 1.50 or greater for light with a wavelength of 400 nm in an aqueous dispersion with a content of the abrasive grains adjusted to 1.0 mass %, but the present inventors conjecture as follows. Specifically, depending on the conditions for production of the tetravalent metal element hydroxide ($M(OH)_4$), it is believed that particles of $M(OH)_3X$, composed of a tetravalent metal ($M^{4+}$), 3 hydroxyl groups (OH) and one anion (X), are produced for some of the abrasive grains. In $M(OH)_3X$, the electron-withdrawing anion (X") acts to improve the reactivity of the hydroxyl groups, and an increasing abundance of $M(OH)_3X$ is thought to lead to improved polishing rate. Also, the $M(OH)_3X$ particles absorb light with a wavelength of 400 nm, and an increased abundance of $M(OH)_3X$ presumably causes increased absorbance for light with a wavelength of 400 nm, and improves the polishing rate.

The absorption peak of $M(OH)_3X$ at a wavelength of 400 nm has been confirmed to be much lower than the absorption peak at a wavelength of 290 nm. In this regard, as a result of studying degrees of absorbance using aqueous dispersions with relatively high abrasive grain contents of 1.0 mass %, which allow absorbance to be easily detected as high absorbance, the present inventors have found that the effect of improving polishing rate is superior when using abrasive grains that produce absorbance of 1.50 or greater for light with a wavelength of 400 nm in the aqueous dispersion.

The absorbance for light with a wavelength of 400 nm is preferably 1.50 or greater, more preferably 2.00 or greater, even more preferably 2.50 or greater and especially preferably 3.00 or greater, from the viewpoint of allowing polishing of films at an even more superior polishing rate. The upper limit for the absorbance for light with a wavelength of 400 nm is not particularly restricted, but is preferably 10.00, for example, as the detection limit of the measuring apparatus. Incidentally, since it is thought that the absorbance for light with a wavelength of 400 nm derives from the abrasive grains, as explained above, naturally it would not be possible to polish a film at a superior polishing rate with a polishing liquid comprising a substance (such as a pigment component exhibiting a yellow color) that produces absorbance of 1.50 or greater for light with a wavelength of 400 nm, instead of abrasive grains that produce absorbance of 1.50 or greater for light with a wavelength of 400 nm.

It is not necessarily fully understood why an effect of improving polishing rate is obtained by using abrasive grains that produce absorbance of 1.000 or greater for light with a wavelength of 290 nm in an aqueous dispersion with a content of the abrasive grains adjusted to 0.0065 mass % (65 ppm), but the present inventors conjecture as follows. Specifically, particles of $M(OH)_3X$ that are produced depending on the production conditions for the tetravalent metal element hydroxide $M(OH)_4$ have a calculated absorption peak at a wavelength of about 290 nm, and for example, particles composed of $Ce^{4+}(OH^-)_3NO_3^-$ have an absorption peak at a wavelength of 290 nm. Consequently, it is believed that the polishing rate is improved in accordance with the increase in absorbance for light with a wavelength of 290 nm due to the increase in the abundance of $M(OH)_3X$.

The absorbance for light with a wavelength of about 290 nm tends to be detected to a greater degree as the measuring limit is exceeded. In this regard, as a result of studying degrees of absorbance using aqueous dispersions with relatively low abrasive grain contents of 0.0065 mass %, which allow absorbance to be easily detected as low absorbance, the present inventors have found that the effect of improving polishing rate is superior when using abrasive grains that produce absorbance of 1.000 or greater for light with a wavelength of 290 nm in the aqueous dispersion. The present inventors have also found that, apart from light with a wavelength of about 400 nm, which when absorbed by an absorbing substance tends to cause the absorbing substance to exhibit a yellow color, higher absorbance of abrasive grains for light with a wavelength of about 290 nm produces deeper yellowishness in a polishing liquid or slurry employing such abrasive grains.

The absorbance for light with a wavelength of 290 nm is preferably 1.000 or greater, more preferably 1.050 or greater, even more preferably 1.100 or greater, especially more preferably 1.200 or greater and extremely preferably 1.300 or greater, from the viewpoint of allowing polishing of films at an even more superior polishing rate. The upper limit for the absorbance for light with a wavelength of 290 nm is not particularly restricted, but is preferably 10.00, for example, as the detection limit of the apparatus.

From the viewpoint of polishing of films at an even more superior polishing rate with a polishing liquid of this embodiment, the abrasive grains are preferably ones that produce absorbance of 1.50 or greater for light with a wavelength of 400 nm in an aqueous dispersion with a content of the abrasive grains adjusted to 1.0 mass %, while also producing absorbance of 1.000 or greater for light with a wavelength of 290 nm in an aqueous dispersion with a content of the abrasive grains adjusted to 0.0065 mass %.

Also, the aforementioned metal hydroxides ($M(OH)_4$ and $M(OH)_3X$) tend not to exhibit absorption for light with wavelengths of 450 nm and greater, and especially for light with wavelengths of 450-600 nm. Therefore, from the viewpoint of minimizing adverse effects on polishing by the presence of impurities, the abrasive grains preferably produce absorbance of not greater than 0.010 for light with a wavelength of 450-600 nm in an aqueous dispersion with a content of the abrasive grains adjusted to 0.0065 mass % (65 ppm). Specifically, the absorbance preferably does not exceed 0.010 for all light within a wavelength range of 450-600 nm in an aqueous dispersion with a content of the abrasive grains adjusted to 0.0065 mass %. The absorbance for light with a wavelength of 450-600 nm is more preferably not greater than 0.005 and even more preferably not greater than 0.001. The lower limit for the absorbance for light with a wavelength of 450-600 nm is preferably 0.

The absorbance in an aqueous dispersion can be measured, for example, using a spectrophotometer (model name: U3310) by Hitachi, Ltd. Specifically, an aqueous dispersion with a content of the abrasive grains adjusted to 0.0065 mass % or 1.0 mass % is prepared as a measuring sample. Approximately 4 mL of the measuring sample is placed in a 1 cm-square cell, and the cell is set in the apparatus. Spectrophotometry is then conducted in a wavelength range of 200-600 nm, and the absorbance is judged from the obtained chart.

If absorbance of at least 1.000 is exhibited when the absorbance for light with a wavelength of 290 nm is measured with excessive dilution so that the abrasive grain content in the measuring sample is lower than 0.0065 mass %, it is clear that the absorbance will also be at least 1.000 when the abrasive grain content is 0.0065 mass %. Thus, the absorbance may be screened by measuring the absorbance using an aqueous dispersion excessively diluted so that the abrasive grain content is lower than 0.0065 mass %.

Screening of the absorbance may also be accomplished by assuming that if absorbance of at least 1.50 is exhibited when the absorbance for light with a wavelength of 400 nm is measured with excessive dilution so that the abrasive grain content is lower than 1.0 mass %, the absorbance will also be at least 1.50 when the abrasive grain content is 1.0 mass %. Also, screening of the absorbance may be accomplished by assuming that if absorbance of not greater than 0.010 is exhibited when the absorbance for light with a wavelength of 450-600 nm is measured with dilution so that the abrasive grain content is greater than 0.0065 mass %, the absorbance will also be not greater than 0.010 when the abrasive grain content is 0.0065 mass %.

[Light Transmittance]

The polishing liquid of this embodiment preferably has high transparency for visible light (it is visually transparent or nearly transparent). Specifically, the abrasive grains of the polishing liquid of this embodiment preferably produce light transmittance of 50%/cm or greater for light with a wavelength of 500 nm in an aqueous dispersion with a content of the abrasive grains adjusted to 1.0 mass %. This can further inhibit reduction in polishing rate by addition of additives, thus making it easier to obtain other properties while maintaining polishing rate. From this viewpoint, the light transmittance is more preferably 60%/cm or greater, even more preferably 70%/cm or greater, especially more preferably 80%/cm or greater and extremely preferably 90%/cm or greater. The upper limit for the light transmittance is 100%/cm.

Although the reason for which reduction in polishing rate can be inhibited by adjusting the light transmittance of the abrasive grains is not thoroughly understood, the present inventors conjecture as follows. The action exhibited as abrasive grains by the tetravalent metal element hydroxide particles, such as cerium hydroxide particles, is thought to depend more on chemical action than on mechanical action. Therefore, the number of abrasive grains is believed to contribute to the polishing rate more than the sizes of the abrasive grains.

In the case of low light transmittance in an aqueous dispersion having an abrasive grain content of 1.0 mass %, the abrasive grains present in the aqueous dispersion presumably have relatively more particles with large particle sizes (hereunder referred to as "coarse particles"). When an additive (such as polyvinyl alcohol (PVA)) is added to a polishing liquid comprising such abrasive grains, other particles aggregate around the coarse particles as nuclei, as shown in FIG. 1. As a result, the number of abrasive grains acting on the surface to be polished per unit area (the effective abrasive grain number) is reduced and the specific surface area of the abrasive grains contacting with the surface to be polished is reduced, whereby presumably reduction in the polishing rate occur.

Figure 2:
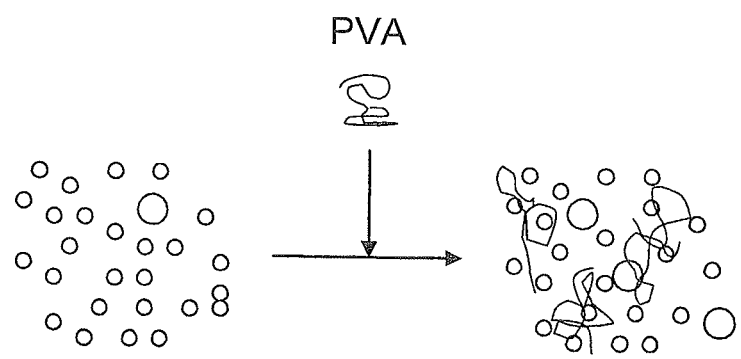
FIG. 2 is a schematic diagram showing the aggregated condition of abrasive grains when an additive has been added.

Conversely, in the case of high light transmittance in an aqueous dispersion having an abrasive grain content of 1.0 mass %, the abrasive grains present in the aqueous dispersion presumably are in the state of fewer "coarse particles". In such cases with a low abundance of coarse particles, few coarse particles are available as nuclei for aggregation, and therefore aggregation between abrasive grains is inhibited or the sizes of the aggregated particles are smaller than the aggregated particles shown in FIG. 1, even when an additive (such as polyvinyl alcohol) is added to the polishing liquid, as shown in FIG. 2. As a result, the number of abrasive grains acting on the surface to be polished per unit area (the effective abrasive grain number) is maintained and the specific surface area of the abrasive grains contacting with the surface to be polished is maintained, whereby presumably reduction in the polishing rate does not easily occur.

According to research by the present inventors, it was found that even among polishing liquids having identical particle sizes to each other as measured with a common particle size measuring apparatus, some may be visually transparent (high light transmittance) and some visually turbid (low light transmittance). This suggests that coarse particles, which produce the action described above, contribute to reduced polishing rate even in slight amounts that cannot be detected with common particle size measuring apparatuses.

It was also found that even repeated filtration to reduce the amount of coarse particles does not significantly improve the phenomenon of reduced polishing rate with addition of additives. The present inventors found that this problem can be overcome by using abrasive grains with high light transmittance in aqueous dispersion, by modifying the production method for the abrasive grains, as explained above.

The light transmittance is the transmittance for light with a wavelength of 500 nm. The light transmittance is measured with a spectrophotometer, and specifically, it is measured with a U3310 Spectrophotometer (apparatus name) by Hitachi, Ltd., for example.

As a more specific measuring method, an aqueous dispersion with a content of the abrasive grains adjusted to 1.0 mass % is prepared as a measuring sample. Approximately 4 mL of the measuring sample is placed in a 1 cm-square cell, the cell is set in the apparatus, and measurement is conducted. If the light transmittance is at least 50%/cm in an aqueous dispersion having an abrasive grain content of greater than 1.0 mass %, it is clear that the light transmittance will also be at least 50%/cm when the measuring sample is diluted to 1.0 mass %. Therefore, using an aqueous dispersion with an abrasive grain content of greater than 1.0 mass % allows screening of the light transmittance by a convenient method.

(Additives)

The polishing liquid of this embodiment allows an especially high polishing rate to be obtained for inorganic insulating films (for example, silicon oxide films), and is therefore especially suitable for polishing of substrates with inorganic insulating films. Also, by appropriate selection of additives, the polishing liquid of this embodiment can provide a high level of both polishing rate and polishing properties other than polishing rate.

An additive that is used may be a known additive without any particular restrictions, such as a dispersing agent that increases the dispersibility of the abrasive grains, a polishing rate improver that improves the polishing rate, a flattening agent (a flattening agent that reduces irregularities on the polished surface after polishing, or a global flattening agent that improves the global flatness of the substrate after polishing), or a selection ratio improver that improves the polishing selective ratio of the inorganic insulating film with respect to stopper films such as silicon nitride films or polysilicon films.

Examples of dispersing agents include vinyl alcohol polymers and their derivatives, betaine, lauryl betaine, lauryldimethylamine oxide, and the like. Examples of polishing rate improvers include β-alanine betaine, stearyl betaine, and the like. Examples of flattening agents that reduce irregularities on polished surfaces include ammonium lauryl sulfate, triethanolamine polyoxyethylene alkyl ether sulfate, and the like. Examples of global flattening agents include polyvinylpyrrolidone, polyacrolein, and the like. Examples of selection ratio improvers include polyethyleneimine, polyallylamine, chitosan, and the like. These may be used alone or in combinations of two or more.

The polishing liquid of this embodiment preferably comprises a vinyl alcohol polymer or a derivative thereof as an additive. However, vinyl alcohol, which is a monomer of polyvinyl alcohol, generally tends not to exist alone as stable compounds Therefore, polyvinyl alcohol is usually obtained by polymerization of a vinyl carboxylate monomer such as vinyl acetate monomer to obtain poly(vinyl carboxylate), followed by saponification (hydrolysis). Thus, a vinyl alcohol polymer obtained using vinyl acetate monomer as the starting material, for example, has —$OCOCH_3$ and hydrolyzed —OH groups as functional groups in the molecule, and the proportion of —OH groups is defined as the saponification degree. That is, a vinyl alcohol polymer whose saponification degree is not 100% has a structure which is essentially a copolymer of vinyl acetate and vinyl alcohol. It may also be one in which a vinyl carboxylate monomer such as vinyl acetate monomer and another vinyl group-containing monomer (for example, ethylene, propylene, styrene or vinyl chloride) are copolymerized, and all or some of the portions derived from the vinyl carboxylate monomer are saponified. In the invention, all of these are collectively referred to as "vinyl alcohol polymers", and a "vinyl alcohol polymer" is ideally a polymer having the following structural formula.

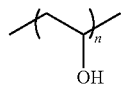

[Chemical Formula 1]

(wherein n represents a positive integer)

A "derivative" of a vinyl alcohol polymer is defined as a term including a derivative of a homopolymer of vinyl alcohol (that is, a polymer with a saponification degree of 100%), and derivatives of copolymers of vinyl alcohol monomer and other vinyl monomers (for example, ethylene, propylene, styrene, vinyl chloride or the like). Examples of such derivatives include polymers having a portion of the hydroxyl groups substituted with amino, carboxyl, ester groups or the like, and polymers having a portion of the hydroxyl groups modified. Examples of such derivatives include reactive polyvinyl alcohols (for example, GOHSEFIMER (registered trademark) Z by Nippon Synthetic Chemical Industry Co., Ltd.), cationized polyvinyl alcohols (for example, GOHSEFIMER (registered trademark) K by Nippon Synthetic Chemical Industry Co., Ltd.), anionized polyvinyl alcohols (for example, GOHSERAN (registered trademark) L and GOHSENOL (registered trademark) T by Nippon Synthetic Chemical Industry Co., Ltd.), and hydrophilic group-modified polyvinyl alcohols (for example, ECOMATI by Nippon Synthetic Chemical Industry Co., Ltd.).

As mentioned above, vinyl alcohol polymers and their derivatives function as abrasive grain dispersing agents, and have effects of improving polishing liquid stability. It is believed that interaction between the hydroxyl group of the vinyl alcohol polymer or its derivative and tetravalent metal element hydroxide particles can inhibit aggregation of the abrasive grains and minimize changes in particle size of the abrasive grains in the polishing liquid, thereby improving stability. Also, by using the vinyl alcohol polymer or its derivative in combination with tetravalent metal element hydroxide particles, it is possible to increase the polishing selective ratio for inorganic insulating films (for example, silicon oxide films) with respect to stopper films (for example, silicon nitride films and polysilicon films) (i.e., polishing rate for inorganic insulating films/polishing rate for stopper films). In addition, a vinyl alcohol polymer and its derivative can also improve the flatness of the polished surface after polishing, and can prevent adhesion of abrasive grains on the polished surface (cleanability improver).

The saponification degree of the vinyl alcohol polymer is preferably not greater than 95 mol % from the viewpoint of further increasing the polishing selective ratio for inorganic insulating films with respect to stopper films. From the same viewpoint, the saponification degree is more preferably not greater than 90 mol %, even more preferably not greater than 88 mol %, especially preferably not greater than 85 mol %, extremely preferably not greater than 83 mol % and very preferably not greater than 80 mol %.

There are no particular restrictions on the lower limit for the saponification degree, but from the viewpoint of excellent solubility in water, it is preferably at least 50 mol %, more preferably at least 60 mol % and even more preferably at least 70 mol %. The saponification degree of the vinyl alcohol polymer can be measured according to JIS K 6726 (Polyvinyl alcohol test method).

There are no particular restrictions on the upper limit for the mean polymerization degree (weight-average molecular weight) of the vinyl alcohol polymer, but from the viewpoint of further inhibiting reduction in polishing rate for inorganic insulating films (for example, silicon oxide films), it is preferably not greater than 3000, more preferably not greater than 2000 and even more preferably not greater than 1000.

From the viewpoint of further increasing the polishing selective ratio for inorganic insulating films with respect to stopper films, the lower limit for the mean polymerization degree is preferably at least 50, more preferably at least 100 and even more preferably at least 150. The mean polymerization degree of the vinyl alcohol polymer can be measured according to JIS K 6726 (Polyvinyl alcohol test method).

In order to adjust the polishing selective ratio for inorganic insulating films with respect to stopper films, and the flatness of polished substrates, a combination of multiple polymers with different saponification degrees or mean polymerization degrees may be used as the vinyl alcohol polymer or its derivative. In such cases, preferably the saponification degree of at least one vinyl alcohol polymer and its derivative is not greater than 95 mol %, and from the viewpoint of further improving the polishing selective ratio, the average saponification degree calculated from each saponification degree and the mixing ratio is preferably not greater than 95 mol %. The preferred range for these saponification degrees is the same range specified above.

From the viewpoint of more efficiently obtaining the effects of additives, the additive content is preferably 0.01 mass % or greater, more preferably 0.1 mass % or greater and even more preferably 1.0 mass % or greater, based on the total mass of the polishing liquid. From the viewpoint of further inhibiting reduction in the polishing rate for inorganic insulating films, the additive content is preferably not greater than 10 mass %, more preferably not greater than 5.0 mass % and even more preferably not greater than 3.0 mass % based on the total mass of the polishing liquid.

(Water)

There are no particular restrictions on the water used in the polishing liquid of this embodiment, but deionized water or ultrapure water is preferred. The water content is not particularly restricted and may be the remaining portion of the polishing liquid excluding the other constituent components.

[Polishing Liquid Properties]

The pH of the polishing liquid is preferably 2.0-9.0, for a satisfactory relationship of the surface potential of the abrasive grains with respect to the surface potential of the surface to be polished, to facilitate action of the abrasive grains on the surface to be polished, and thereby obtaining a more superior polishing rate. From the viewpoint of stabilizing the pH of the polishing liquid and minimizing problems such as aggregation of the abrasive grains due to addition of a pH stabilizer, the lower limit for the pH is preferably 2.0 or higher, more preferably 4.0 or higher and even more preferably 5.0 or higher. Also, from the viewpoint of excellent dispersibility of the abrasive grains and obtaining a more superior polishing rate, the upper limit for the pH is preferably not higher than 9.0, more preferably not higher than 7.5 and even more preferably not higher than 6.5. The pH of the polishing liquid can be measured by the same method as for the pH of the liquid mixture.

Any known pH regulator may be used to adjust the pH of the polishing liquid, without any particular restrictions, and specifically, there may be used inorganic acids such as phosphoric acid, sulfuric acid or nitric acid, organic acids such as formic acid, acetic acid, propionic acid, maleic acid, phthalic acid, citric acid or succinic acid, amines such as ethylenediamine, toluidine, piperazine, histidine or aniline, and nitrogen-containing heterocyclic compounds such as pyridine, imidazole, triazole or pyrazole.

A pH stabilizer is an additive for adjustment to a prescribed pH, and it is preferably a buffer component. The buffer component is preferably a compound with a pKa in the range of ±1.5, and more preferably a compound with a pKa in the range of ±1.0, relative to the prescribed pH. Such compounds include amino acids such as glycine, arginine, lysine, asparagine, aspartic acid and glutamic acid, amines such as ethylenediamine, 2-aminopyridine, 3-aminopyridine, picolinic acid, histidine, piperazine, morpholine, piperidine, hydroxylamine and aniline, nitrogen-containing heterocyclic compounds such as pyridine, imidazole, benzimidazole, pyrazole, triazole and benzotriazole, and carboxylic acids such as formic acid, acetic acid, propionic acid, malonic acid, succinic acid, glutaric acid, adipic acid, maleic acid, fumaric acid, phthalic acid, citric acid, lactic acid and benzoic acid.

<Slurry>

The slurry of this embodiment may be used directly for polishing, or it may be used as a slurry in a "two-pack type polishing liquid", having the constituent components of the polishing liquid separated into a slurry and an additive solution. According to this embodiment, the polishing liquid and the slurry differ in the presence or absence of additives, and the polishing liquid is obtained by adding the additives to the slurry.

The slurry of this embodiment comprises at least the same abrasive grains as the polishing liquid of this embodiment, and water. For example, the abrasive grains include a tetravalent metal element hydroxide, and the mean secondary particle size of the abrasive grains is the same as the abrasive grains used in the polishing liquid of this embodiment.

In the slurry of this embodiment, the abrasive grains satisfy condition (a), while also satisfying either or both of conditions (b) and (c). Also, the abrasive grains preferably produce absorbance of not greater than 0.010 for light with a wavelength of 450-600 nm in an aqueous dispersion with a content of the abrasive grains adjusted to 0.0065 mass %. The abrasive grains also preferably produce light transmittance of 50%/cm or greater for light with a wavelength of 500 nm in an aqueous dispersion with a content of the abrasive grains adjusted to 1.0 mass %. These preferred ranges and measuring methods for the absorbance and light transmittance are the same as for the polishing liquid of this embodiment.

In the slurry of this embodiment, the abrasive grain content is not particularly restricted, but it is preferably not greater than 15 mass % based on the total mass of the slurry, from the viewpoint of helping to avoid aggregation of the abrasive grains. The abrasive grain content is preferably 0.01 mass % or greater based on the total mass of the slurry, from the viewpoint of allowing the mechanical effect of the abrasive grains to be easily obtained.

Of the constituent components of the slurry of this embodiment, the tetravalent metal element hydroxide is believed to have a major effect on the polishing properties. The tetravalent metal element hydroxide content is preferably not greater than 10 mass % based on the total mass of the slurry, from the viewpoint of helping to avoid aggregation of the abrasive grains, as well as achieving satisfactory chemical interaction with the surface to be polished and thereby allowing further improvement in the polishing rate. The tetravalent metal element hydroxide content is preferably 0.01 mass % or greater based on the total mass of the slurry, from the viewpoint of allowing the function of the tetravalent metal element hydroxide to be adequately exhibited.

The pH of the slurry of this embodiment is preferably 2.0-9.0, for a satisfactory surface potential of the abrasive grains with respect to the surface potential of the surface to be polished, to facilitate action of the abrasive grains on the surface to be polished, and thereby obtaining a more superior polishing rate. Also, from the viewpoint of stabilizing the pH of the slurry and minimizing problems such as aggregation of the abrasive grains due to addition of a pH stabilizer, the lower limit for the pH is preferably at least 2.0, more preferably at least 2.5 and even more preferably at least 3.0. Furthermore, from the viewpoint of excellent dispersibility of the abrasive grains and obtaining a more superior polishing rate, the upper limit for the pH is preferably not higher than 9.0, more preferably not higher than 7.0 and even more preferably not higher than 5.0. The pH of the slurry can be measured by the same method as for the pH of the liquid mixture.

<Polishing Liquid Set>

According to this embodiment, it is also possible to provide a polishing liquid set that can accomplish polishing of films at a superior polishing rate compared to conventional polishing liquids, while maintaining the effects of adding additives. In the polishing liquid set of this embodiment, the constituent components of the polishing liquid are separately stored as a slurry and an additive solution, so that the slurry (first liquid) and additive solution (second liquid) are mixed to form the polishing liquid. The slurry used may be the slurry according to this embodiment. The additive solution used may be a solution having the additive dissolved in water. The polishing liquid set is used as a polishing liquid by mixing the slurry and additive solution at the time of polishing. By thus separately storing the constituent components of the polishing liquid into at least two liquids, it is possible to obtain a polishing liquid with excellent storage stability.

The additives used in the additive solution may be the same additives as described for the polishing liquid. The content of additives in the additive solution is preferably 0.01-20 mass % and more preferably 0.02-20 mass %, based on the total mass of the additive solution, from the viewpoint of inhibiting excessive reduction in the polishing rate when the additive solution and slurry are mixed to form the polishing liquid.

There are no particular restrictions on the water for the additive solution, but deionized water or ultrapure water is preferred. The water content is not particularly restricted and may be the content of the remainder excluding the other constituent components.

<Substrate Polishing Method and Substrate>

According to this embodiment, it is also possible to provide a polishing method using the aforementioned slurry, polishing liquid set or polishing liquid, and a substrate obtained by the method. A substrate polishing method using the aforementioned slurry, polishing liquid set or polishing liquid, and a substrate obtained by the method, will now be described. When the polishing liquid or slurry is to be used, it will be a polishing method using a one-pack type polishing liquid, and when the polishing liquid set is to be used, it will be a polishing method using a two-pack type polishing liquid or a three-pack or greater type polishing liquid. The substrate polishing method of this embodiment has excellent throughput since it allows polishing of films at superior polishing rate, while permitting desired properties (such as flatness and selectivity) to be obtained when using additives.

A substrate of this embodiment can be obtained by polishing with the substrate polishing method according to this embodiment. In the substrate polishing method of this embodiment, polishing is performed on a substrate having a film to be polished on its surface. In the substrate polishing method of this embodiment, the film to be polished may be polished using a stopper film formed under the film to be polished. The substrate polishing method of this embodiment comprises at least a substrate positioning step and a polishing step. In the substrate positioning step, a film to be polished, of a substrate which has the film to be polished on its surface, is placed so as to face an abrasive pad.

The film to be polished is preferably an inorganic insulating film, such as a silicon oxide film. The silicon oxide film can be obtained by a low-pressure CVD method, plasma CVD, or the like. The silicon oxide film may be doped with an element such as phosphorus or boron. The inorganic insulating film may be a Low-k film or the like. The surface of the film to be polished (surface to be polished) preferably has irregularities. In the substrate polishing method of this embodiment, the convexities of the irregularities of the film to be polished are preferentially polished, to obtain a substrate with a flattened surface.

When a slurry is to be used as a one-pack type polishing liquid, the substrate polishing method of this embodiment comprises, for example, a substrate positioning step, and a polishing step in which at least a portion of a film to be polished is polished while supplying a slurry obtained by the aforementioned production method for a slurry between the abrasive pad and the film to be polished.

When a polishing liquid is to be used as a one-pack type polishing liquid, the substrate polishing method of this embodiment comprises, for example, a substrate positioning step, and a polishing step in which at least a portion of a film to be polished is polished while supplying a polishing liquid between the abrasive pad and the film to be polished. In this case, a polishing liquid preparation step may be carried out before the polishing step. The polishing liquid preparation step may be, for example, the following steps (A) to (C).

(A) A step of mixing a slurry obtained by the aforementioned production method for a slurry, and an additive to obtain a polishing liquid.

(B) A step of mixing abrasive grains obtained by the aforementioned production method for abrasive grains, and an additive and water to obtain a polishing liquid.

(C) A step of mixing the slurry (first liquid) of the aforementioned polishing liquid set and the additive solution (second liquid) to obtain a polishing liquid. In this case, the slurry and additive solution are conveyed through separate liquid conveyance systems (for example, tubings), and the tubings are merged just before the supply tubing outlet to obtain a polishing liquid.

In the polishing step, in the state that the film to be polished of the substrate is pressed against the abrasive pad of the polishing platen, at least a portion of the film to be polished may be polished by relatively moving the substrate and the polishing platen while supplying the slurry or polishing liquid between the abrasive pad and the film to be polished. Here, the slurry or polishing liquid may be supplied onto the abrasive pad directly as a slurry or polishing liquid with the prescribed water content.

When a two-pack type of polishing liquid is to be used, the substrate polishing method of this embodiment comprises, for example, a substrate positioning step, and a polishing step in which at least a portion of the film to be polished is polished while respectively supplying the slurry (first liquid) of the aforementioned polishing liquid set and the additive solution (second liquid) between the abrasive pad and the film to be polished. In this case, in the polishing step, at least a portion of the film to be polished is polished by a polishing liquid obtained by mixing a slurry and an additive solution. In this polishing method, the slurry and additive solution can be supplied onto the abrasive pad through separate liquid conveyance systems (for example, tubings).

From the viewpoint of minimizing costs for preservation, transport and storage, the polishing liquid and slurry of this embodiment can be stored as a storage solution for a polishing liquid or a storage solution for a slurry to be used, for example, in a two-fold or greater dilution with a liquid medium such as water at the time of use.

The storage solution may be diluted with the liquid medium immediately before polishing, or the storage solution and liquid medium may be supplied onto the abrasive pad for dilution on the abrasive pad.

Since a greater dilution factor of the storage solution results in a greater effect of minimizing cost for preservation, transport and storage, it is preferably two-fold or greater and more preferably 3-fold or greater. There are no particular restrictions on the upper limit, but a greater dilution factor requires a greater amount of components in the storage solution (a higher concentration), which tend to lower the stability during storage, and therefore it is preferably not greater than 500-fold, more preferably not greater than 200-fold, even more preferably not greater than 100-fold and especially preferably not greater than 50-fold. The same is applied for a polishing liquid with the constituent components divided into 3 or more liquids.

The polishing apparatus to be used in the polishing method of this embodiment may be, for example, a common polishing apparatus comprising a holder to hold the substrate with the film to be polished, and a polishing platen that mounts a motor having a variable rotational speed and allows attachment of an abrasive pad. Examples of such polishing apparatuses include a polishing apparatus by Ebara Corp. (Model EPO-111), and a polishing apparatuses by Applied Materials (trade names: Mirra3400 and Reflection Polishing Machine).

There are no particular restrictions on the abrasive pad, and a common nonwoven fabric, foamed polyurethane, porous fluorine resin or the like may be used. The abrasive pad is preferably furrowed to allow accumulation of the polishing liquid.

The polishing conditions are not particularly restricted, but from the viewpoint of minimizing fly off of the semiconductor substrate, the rotational speed of the polishing platen is preferably a low speed of not greater than 200 rpm. The pressure (machining load) on the semiconductor substrate is preferably not greater than 100 kPa, from the viewpoint of further minimizing formation of scratches after polishing. The slurry or polishing liquid is preferably continuously supplied to the surface of the abrasive pad with a pump or the like during polishing. The amount supplied is not particularly restricted, but the surface of the abrasive pad is preferably covered by the slurry or polishing liquid at all times. Preferably, the polished semiconductor substrate is thoroughly rinsed in running water, and is then dried after removing off the water droplets adhering to the semiconductor substrate using a spin dryer or the like.

According to this embodiment, there is provided the use of the aforementioned polishing liquid, slurry and polishing liquid set for polishing of a film to be polished (for example, a silicon oxide film). Also according to this embodiment, there is provided the use of the aforementioned polishing liquid, slurry and polishing liquid set for polishing of a film to be polished (for example, a silicon oxide film) using a stopper film (for example, a silicon nitride film).

EXAMPLES

The present invention will now be described in greater detail by examples, with the understanding that the invention is not limited to these examples.

Examples 1-14, Comparative Examples 1-3

(Preparation of Abrasive Grains Including Tetravalent Metal Element Hydroxide)

Abrasive grains including tetravalent metal element hydroxides were prepared by the following procedure. The values indicated as A to I and Z throughout the explanation below are the values shown in Table 1.

After placing A [L] of water into a container, B [L] of cerium ammonium nitrate aqueous solution (general formula: N Ce(NH$_4$)$_2$(NO$_3$)$_6$, formula weight: 548.2 g/mol) at a concentration of 50 mass % was added and mixed therewith, and the liquid temperature was adjusted to C [° C.] to obtain a metal salt aqueous solution. The metal salt concentration of the metal salt aqueous solution was as shown in Table 1.

Next, the alkali shown in Table 1 was dissolved in water to prepare E [L] of an aqueous solution at a concentration of D µmol/L], and the liquid temperature was adjusted to a temperature of C [° C.] to obtain an alkali solution.

A cooling device was used to adjust the metal salt aqueous solution to the temperature indicated by C [° C.] in Table 1. The container holding the metal salt aqueous solution was placed in a water tank filled with water and cooled while adjusting the water temperature of the water tank using an external-circulating Coolnics Circulator (product name: Cooling Thermopump CTP101 by Eyela). The temperature of the metal salt aqueous solution was kept at C [° C.] while pouring the alkali solution at the mixing rate indicated by F [m$^3$/min] in Table 1, and mixing was carried out at the linear speed indicated by G [m/min], the cycle count indicated by H [min$^{-1}$] and the substitution count indicated by I [min$^{-1}$] in Table 1, to obtain slurry precursor 1 containing abrasive grains of a tetravalent cerium hydroxide. The area of the stirring blade, the radius of rotation of the stirring blade and the rotational speed of the stirring blade were as shown in Table 1. The pH of the slurry precursor 1 is shown in the column "Final pH" in Table 1, and the ΔpH value, as the variation in pH per unit time, was as shown in Table 1. The value used for ΔpH was the average value of the change in pH per minute from the start of mixing of the metal salt aqueous solution and alkali solution until the pH of the liquid mixture reached the "final pH". Parameter Z was also as shown in Table 1.

After again adding water to the obtained resultant solid to adjust the liquid volume to 2.0 L, ultrasonic dispersion treatment was carried out for 180 minutes to obtain slurry precursor 2. A suitable amount of the obtained slurry precursor 2 was sampled, and the mass after drying (the nonvolatile component mass) was measured to calculate the content of tetravalent cerium hydroxide abrasive grains in the slurry precursor 2.

(Measurement of Absorbance and Light Transmittance)

A suitable amount of slurry precursor 2 was sampled and diluted with water to an abrasive grain content of 0.0065 mass % (65 ppm) to obtain a measuring sample (aqueous dispersion). Approximately 4 mL of the measuring sample was placed in a 1 cm-square cell, the cell was set in a spectropho-

TABLE 1

| | Metal salt aqueous solution | | | Alkali solution | | | Production parameters | |
|---|---|---|---|---|---|---|---|---|
| | 50 mass % | | | | | | | |
| | Water amount A [L] | metal salt solution amount B [L] | Concentration [mol/L] | Alkali type | Concentration D [mol/L] | Alkali solution amount E [L] | Mixing speed v F [m³/min] | Rotation rate R [min$^{-1}$] |
| Example 1 | 1.840 | 0.053 | 0.037 | Ammonia | 8.8 | 0.029 | 0.000005 | 500 |
| Example 2 | 1.656 | 0.048 | 0.037 | Imidazole | 1.5 | 0.148 | 0.00001 | 500 |
| Example 3 | 1.656 | 0.048 | 0.037 | Imidazole | 1.5 | 0.157 | 0.00001 | 500 |
| Example 4 | 1.656 | 0.048 | 0.037 | Imidazole | 1.5 | 0.152 | 0.00001 | 200 |
| Example 5 | 1.656 | 0.048 | 0.037 | Imidazole | 1.5 | 0.152 | 0.00001 | 500 |
| Example 6 | 1.656 | 0.048 | 0.037 | Imidazole | 1.5 | 0.152 | 0.00001 | 500 |
| Example 7 | 1.656 | 0.048 | 0.037 | Imidazole | 1.5 | 0.152 | 0.000007 | 500 |
| Example 8 | 1.656 | 0.048 | 0.037 | Imidazole | 1.5 | 0.152 | 0.000015 | 500 |
| Example 9 | 165.600 | 4.767 | 0.037 | Imidazole | 1.5 | 15.2 | 0.00008 | 100 |
| Example 10 | 165.600 | 4.767 | 0.037 | Imidazole | 1.5 | 15.2 | 0.00008 | 70 |
| Example 11 | 1.656 | 0.048 | 0.037 | Imidazole | 2.9 | 0.076 | 0.000005 | 200 |
| Example 12 | 1.587 | 0.095 | 0.075 | Imidazole | 1.5 | 0.304 | 0.00001 | 200 |
| Example 13 | 1.587 | 0.095 | 0.075 | Imidazole | 1.5 | 0.304 | 0.000007 | 300 |
| Example 14 | 1.691 | 0.024 | 0.018 | Imidazole | 1.5 | 0.078 | 0.000007 | 500 |
| Comp. Ex. 1 | 1.840 | 0.053 | 0.037 | Ammonia | 14.7 | 0.017 | 0.000025 | 150 |
| Comp. Ex. 2 | 2.500 | 0.028 | 0.014 | Potassium hydroxide | 1.8 | 0.070 | 0.00001 | 400 |
| Comp. Ex. 3 | 1.840 | 0.053 | 0.037 | Ammonia | 14.7 | 0.017 | 0.00001 | 500 |

| | Production parameters | | | | | | | |
|---|---|---|---|---|---|---|---|---|
| | Stirring blade area S [m²] | Rotation radius r [m] | Synthesis temp. T C [° C.] | Final pH | ΔpH [min$^{-1}$] | Linear speed u G [m/min] | Cycle count N H [min$^{-1}$] | Substitution count M I [min$^{-1}$] | Parameter Z |
| Example 1 | 0.0005 | 0.025 | 20 | 5.2 | 0.69 | 78.50 | 19.63 | 0.0026 | 7.73 |
| Example 2 | 0.0005 | 0.025 | 25 | 3.5 | 0.16 | 78.50 | 20.37 | 0.0054 | 17.14 |
| Example 3 | 0.0005 | 0.025 | 25 | 5.2 | 0.25 | 78.50 | 20.26 | 0.0054 | 10.46 |
| Example 4 | 0.0020 | 0.040 | 25 | 4.2 | 0.20 | 50.24 | 54.31 | 0.0054 | 36.00 |
| Example 5 | 0.0005 | 0.025 | 10 | 5.2 | 0.26 | 78.50 | 20.37 | 0.0054 | 28.64 |
| Example 6 | 0.0005 | 0.025 | 15 | 5.2 | 0.26 | 78.50 | 20.37 | 0.0054 | 20.25 |
| Example 7 | 0.0005 | 0.025 | 10 | 5.2 | 0.18 | 78.50 | 20.37 | 0.0038 | 58.44 |
| Example 8 | 0.0005 | 0.025 | 5 | 5.2 | 0.39 | 78.50 | 20.37 | 0.0081 | 18.00 |
| Example 9 | 0.0340 | 0.150 | 15 | 5.2 | 0.02 | 94.20 | 17.26 | 0.0004 | 2689.36 |
| Example 10 | 0.0340 | 0.150 | 20 | 5.2 | 0.02 | 65.94 | 12.08 | 0.0004 | 1331.16 |
| Example 11 | 0.0020 | 0.040 | 20 | 5.2 | 0.26 | 50.24 | 56.45 | 0.0028 | 76.36 |
| Example 12 | 0.0020 | 0.040 | 15 | 5.2 | 0.13 | 50.24 | 50.75 | 0.0051 | 108.00 |
| Example 13 | 0.0020 | 0.040 | 15 | 5.2 | 0.09 | 75.36 | 76.12 | 0.0035 | 330.60 |
| Example 14 | 0.0005 | 0.025 | 20 | 5.3 | 0.36 | 78.50 | 21.93 | 0.0039 | 15.62 |
| Comp. Ex. 1 | 0.0005 | 0.025 | 25 | 5.2 | 5.88 | 23.55 | 5.92 | 0.0131 | 0.05 |
| Comp. Ex. 2 | 0.0005 | 0.025 | 25 | 5.2 | 0.57 | 62.80 | 11.64 | 0.0039 | 3.73 |
| Comp. Ex. 3 | 0.0005 | 0.025 | 25 | 5.2 | 2.35 | 78.50 | 19.73 | 0.0052 | 1.13 |

Slurry precursor 1 was centrifuged and subjected to solid-liquid separation by decantation to remove the liquid. The procedure of adding a suitable amount of water to the obtained resultant solid, thoroughly stirring and conducting solid-liquid separation by decantation was carried out an additional 3 times.

tometer (apparatus name: U3310) by Hitachi, Ltd., and spectrophotometry was performed in a wavelength range of 200-600 nm to determine the absorbance at a wavelength of 290 nm and the absorbance at a wavelength of 450-600 nm. The results are shown in Table 2.

A suitable amount of slurry precursor 2 was also sampled and diluted with water to an abrasive grain content of 1.0 mass % to obtain a measuring sample (aqueous dispersion). Approximately 4 mL of the measuring sample was placed in a 1 cm-square cell, the cell was set in a spectrophotometer (apparatus name: U3310) by Hitachi, Ltd., and spectrophotometry was performed in a wavelength range of 200-600 nm to measure the absorbance for light with a wavelength of 400 nm and the light transmittance for light with a wavelength of 500 nm. The results are shown in Table 2.

(Measurement of Mean Secondary Particle Size)

A suitable amount of slurry precursor 2 was sampled and diluted with water to an abrasive grain content of 0.2 mass % to obtain a measuring sample. Approximately 4 mL of the measuring sample was placed in a 1 cm-square cell, and the cell was set in an N5, an apparatus name by Beckman Coulter, Inc. Measurement was conducted at 25° C. with a dispersing medium refractive index of 1.33 and a viscosity of 0.887 mPa·s, and the displayed mean particle size value was read as the mean secondary particle size. The results are shown in Table 2.

TABLE 2

| | Absorbance [290 nm] Abrasive grain content: 65 ppm | Absorbance [450~600 nm] | Absorbance [400 nm] Abrasive grain content: 1.0 mass % | Light transmittance [500 nm] [%/cm] | Mean secondary particle size [nm] |
|---|---|---|---|---|---|
| Example 1 | 1.112 | <0.010 | 1.57 | 62 | 52 |
| Example 2 | 1.192 | <0.010 | 2.25 | 92 | 21 |
| Example 3 | 1.086 | <0.010 | 1.57 | 91 | 26 |
| Example 4 | 1.230 | <0.010 | 2.04 | >99 | 22 |
| Example 5 | 1.140 | <0.010 | 1.83 | >99 | 25 |
| Example 6 | 1.153 | <0.010 | 1.88 | >99 | 22 |
| Example 7 | 1.238 | <0.010 | 2.28 | >99 | 24 |
| Example 8 | 1.133 | <0.010 | 1.98 | >99 | 21 |
| Example 9 | 1.368 | <0.010 | 3.11 | >99 | 19 |
| Example 10 | 1.271 | <0.010 | 2.84 | >99 | 20 |
| Example 11 | 1.159 | <0.010 | 2.31 | >99 | 24 |
| Example 12 | 1.191 | <0.010 | 2.60 | >99 | 23 |
| Example 13 | 1.339 | <0.010 | 3.02 | >99 | 18 |
| Example 14 | 1.201 | <0.010 | 2.02 | >99 | 20 |
| Comp. Ex. 1 | 1.256 | <0.010 | 2.70 | 41 | 95 |
| Comp. Ex. 2 | 1.239 | <0.010 | 2.22 | 46 | 91 |
| Comp. Ex. 3 | 1.246 | <0.010 | 2.69 | 43 | 101 |

(Preparation of Polishing Liquids)

Water was added to slurry precursor 2 for adjustment to an abrasive grain content of 1 mass % to obtain a storage solution for a slurry. The results of observing the outer appearance of each storage solution for a slurry are shown in Table 3.

Purified water was added to 60 g of the storage solution for a slurry to obtain a slurry. Also, a 5 mass % polyvinyl alcohol aqueous solution was prepared as an additive solution. After adding 60 g of the additive solution to the slurry, the mixture was mixed and stirred to obtain a polishing liquid with an abrasive grain content of 0.2 mass %. The amount of purified water added was calculated to be for a final abrasive grain content of 0.2 mass %. The saponification degree of polyvinyl alcohol in the polyvinyl alcohol aqueous solution was 80 mol %, and the mean polymerization degree was 300. The polyvinyl alcohol content in the polishing liquid was 1.0 mass %. The pH (25° C.) values of the slurry and polishing liquid, as measured using a Model PH81 by Yokogawa Electric Corp., were 3.6 and 6.0.

(Polishing of Insulating Film)

A ϕ200 mm silicon wafer, with a silicon oxide insulating film formed thereon, was set in the holder of a polishing apparatus, mounting an adsorption pad for substrate attachment. The holder was placed on a porous urethane resin pad-attached platen, with the insulating film facing the pad. The substrate was pressed onto the pad at a polishing load of 20 kPa while supplying the obtained polishing liquid onto the pad at a feed rate of 200 cc/min. Polishing was performed for 1 minute of rotation of the platen at 78 rpm and the holder at 98 rpm. The polished wafer was thoroughly washed with purified water and dried. A light-interference film thickness meter was used to measure the change in film thickness before and after polishing, and the polishing rate was calculated. The results are shown in Table 3.

TABLE 3

| | Outer appearance of storage solution for slurry | Polishing rate (nm/min) |
|---|---|---|
| Example 1 | Slightly turbid, faint yellow | 280 |
| Example 2 | Transparent, faint yellow | 380 |
| Example 3 | Transparent, faint yellow | 327 |

TABLE 3-continued

| | Outer appearance of storage solution for slurry | Polishing rate (nm/min) |
|---|---|---|
| Example 4 | Transparent, faint yellow | 350 |
| Example 5 | Transparent, faint yellow | 365 |
| Example 6 | Transparent, faint yellow | 355 |
| Example 7 | Transparent, faint yellow | 377 |
| Example 8 | Transparent, faint yellow | 368 |
| Example 9 | Transparent, faint yellow | 405 |
| Example 10 | Transparent, faint yellow | 401 |
| Example 11 | Transparent, faint yellow | 390 |
| Example 12 | Transparent, faint yellow | 410 |
| Example 13 | Transparent, faint yellow | 418 |
| Example 14 | Transparent, faint yellow | 335 |
| Comp. Ex. 1 | Turbid, white | 170 |
| Comp. Ex. 2 | Turbid, white | 190 |
| Comp. Ex. 3 | Turbid, white | 175 |

Evaluation of the absorbance, light transmittance and polishing rate were all conducted within 24 hours after preparing slurry precursor 2.

Figure 3:
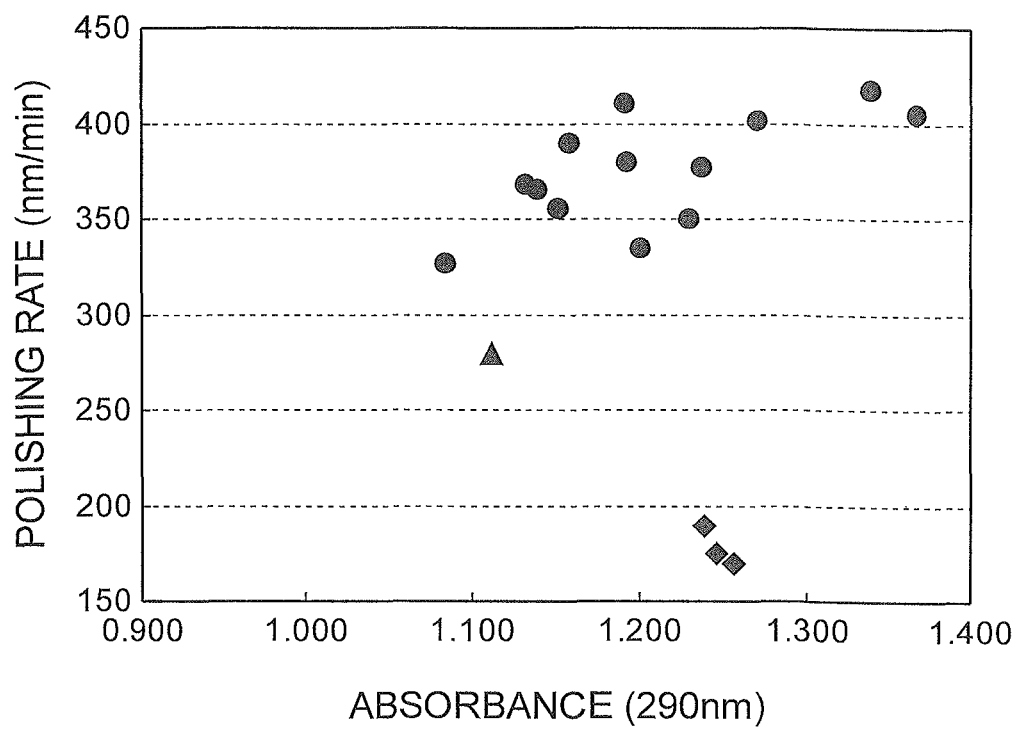
FIG. 3 is a figure showing the relationship between absorbance for light with a wavelength of 290 nm and polishing rate.
Figure 4:
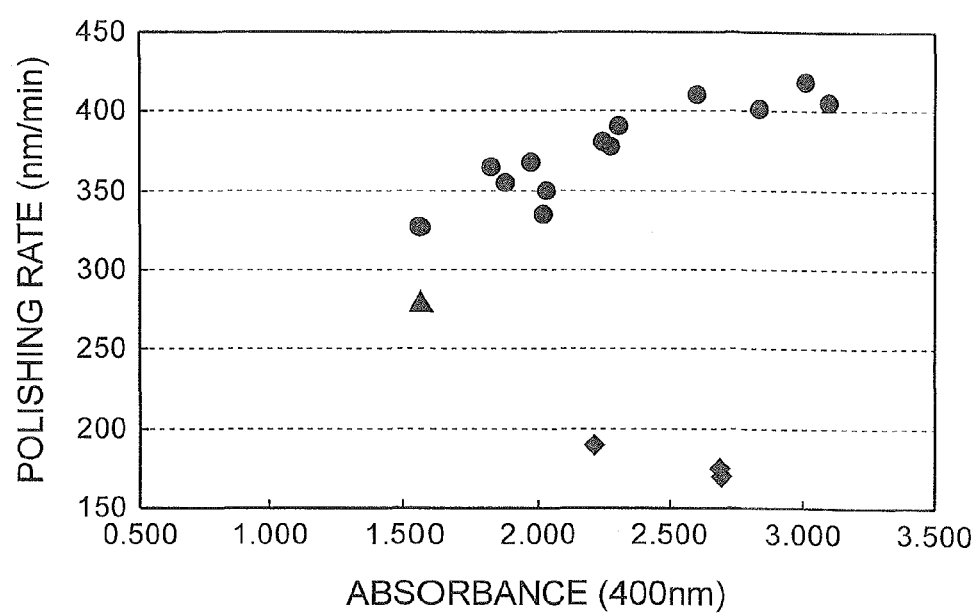
FIG. 4 is a figure showing the relationship between absorbance for light with a wavelength of 400 nm and polishing rate.

The relationship between absorbance for light with a wavelength of 290 nm and polishing rate is shown in FIG. 3, and the relationship between absorbance for light with a wavelength of 400 nm and polishing rate is shown in FIG. 4.

Figure 5:
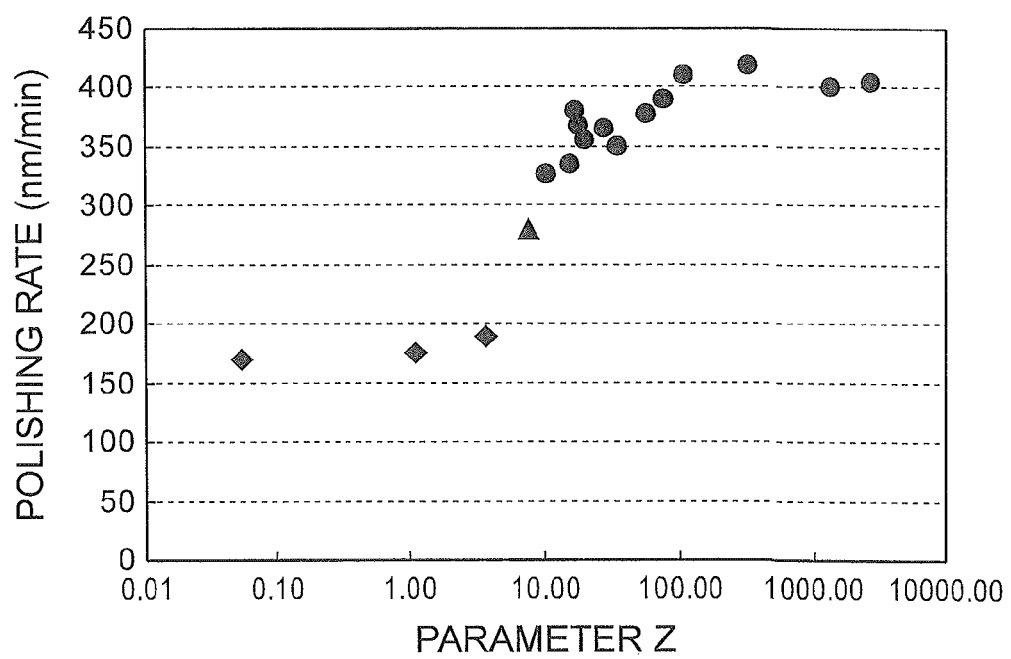
FIG. 5 is a figure showing the relationship between parameter Z and polishing rate.
Figure 6:
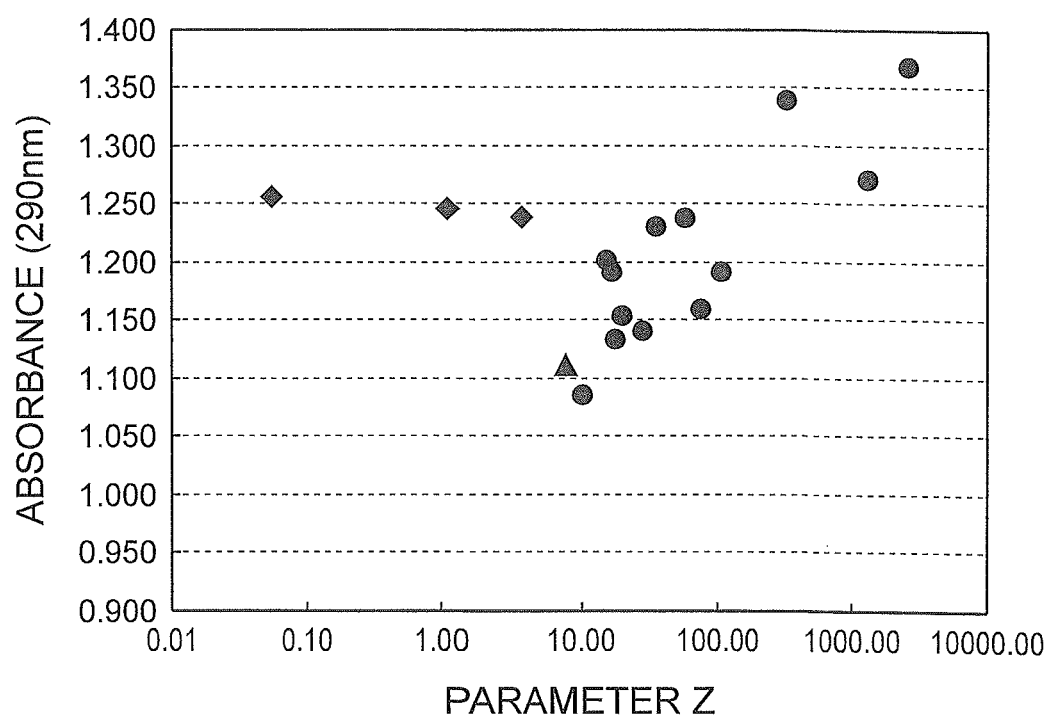
FIG. 6 is a figure showing the relationship between parameter Z and absorbance for light with a wavelength of 290 nm.
Figure 7:
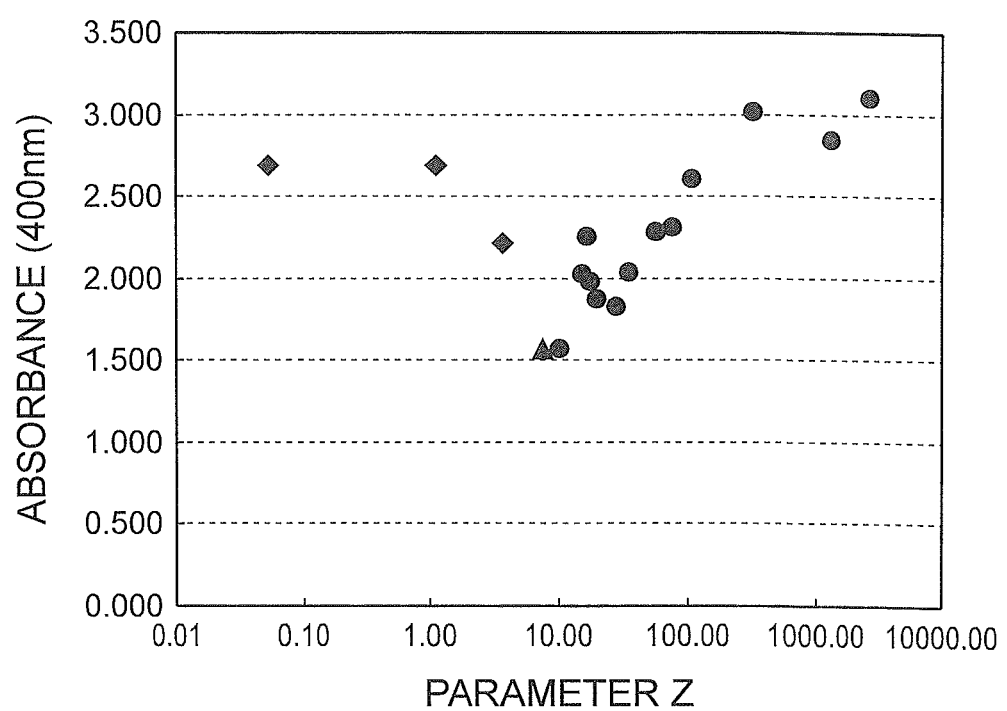
FIG. 7 is a figure showing the relationship between parameter Z and absorbance for light with a wavelength of 400 nm.

FIG. 5 shows the relationship between parameter Z, set during synthesis of the abrasive grains of the invention, and the polishing rate, FIG. 6 shows the relationship between parameter Z and the absorbance for light with a wavelength of 290 nm, and FIG. 7 shows the relationship between parameter Z and the absorbance for light with a wavelength of 400 nm.

In FIGS. 3 to 7, a case with a light transmittance of 90%/cm or greater is indicated by a circle, a case with a light transmittance of at least 50%/cm and less than 90%/cm is indicated by a triangle, and a case with a light transmittance of less than 50%/cm is indicated by a diamond. In FIGS. 5 to 7, the abscissa is a logarithmic axis.

As clearly seen in FIG. 5, a larger value for parameter Z is associated with improved polishing rate. Also, as clearly seen in FIGS. 6 and 7, when the light transmittance is 50%/cm or greater, a larger value for parameter Z results in higher absorbance for light of 290 nm or 400 nm.

Next, using a polishing liquid obtained using the slurry of Example 4 and a polishing liquid obtained using the slurry of Comparative Example 1, the relationship between polyvinyl alcohol (PVA) content of the polishing liquid and polishing rate was examined. Specifically, the polishing rates for silicon oxide films were examined in the same manner as Example 1, with polyvinyl alcohol contents of 3.0 mass %, 2.0 mass %, 1.0 mass %, 0.5 mass % and 0.1 mass % in the polishing liquid. The results are shown in Table 4.

TABLE 4

| PVA content (mass %) | | 3.0 | 2.0 | 1.0 | 0.5 | 0.1 |
|---|---|---|---|---|---|---|
| Polishing rate (nm/min) | Comp. Ex. 1 | 90 | 135 | 170 | 225 | 232 |
| | Example 4 | 253 | 312 | 350 | 375 | 384 |

As is clear by the results in Table 4, the polishing rate in Example 4, which had a light transmittance of at least 50%/cm for light with a wavelength of 500 nm, was higher than in Comparative Example 1 with addition of additives in the same amount, and therefore a wide margin exists for further addition of additives, in addition to polyvinyl alcohol. This suggests that the effective number of abrasive grains on the surface to be polished was maintained by increased light transmittance for inhibited formation of coarse aggregated particles, and that increased absorbance allowed the polishing rate to be maintained at a higher value than Comparative Example 1. This indicates that in Example 4 it is possible to impart further properties by adding more additives, compared to Comparative Example 1.

The invention claimed is:

1. A production method for abrasive grains, comprising mixing a first liquid, which is an aqueous solution of at least one tetravalent metal element salt, and a second liquid which is a solution of at least one alkali, so as to form a liquid mixture, under conditions such that parameter Z in the following formula (1) is 5.00 or greater, to yield abrasive grains including a hydroxide of the tetravalent metal element, wherein during the mixing the liquid mixture is stirred using a stirring blade, wherein the tetravalent metal element is at least one kind selected from the group consisting of scandium, yttrium, lanthanum, cerium, praseodymium, neodymium, promethium, gadolinium, terbium, dysprosium, holmium, erbium, thulium, ytterbium and lutetium, and wherein the alkali is selected from the group consisting of ammonia, triethylamine, pyridine, piperidino, pyrrolidine, imidazole, chitosan, potassium hydroxide and sodium hydroxide:

$$Z=(1/(\Delta pH \times k)) \times (N/M)/1000 \quad (1),$$

wherein in formula (1), $\Delta pH$ represents a variation in pH per minute in a reaction system of the liquid mixture, k represents a reaction temperature coefficient represented by the following formula (2), N represents a cycle count (min$^{-1}$) represented by the following formula (3), and M represents a substitution count (min$^{-1}$) represented by the following formula (5);

$$k=2^{((T-20)/10)} \quad (2),$$

wherein in formula (2), T represents a temperature (° C.) of the reaction system;

$$N=(u \times S)/Q \quad (3),$$

wherein in formula (3), u represents a linear speed (m/min) represented by the following formula (4), for the stirring blade stirring the liquid mixture obtained by mixing the first liquid and the second liquid, S represents an area (m$^2$) of the stirring blade, and Q represents a liquid volume (m$^3$) of the liquid mixture;

$$u=2\pi \times R \times r \quad (4),$$

wherein in formula (4), R represents a rotational speed (min$^{-1}$) of the stirring blade, and r represents a radius of rotation (m) of the stirring blade; and $$M=v/Q \quad (5),$$

wherein in formula (5), v represents a mixing rate (m$^3$/min) of the first liquid and second liquid, and Q represents a liquid volume (m$^3$) of the liquid mixture, and wherein:
the $\Delta pH$ is in the range of 0.001 to 5.00,
the cycle count N is in the range of 1.00 min$^{-1}$ to 200.00 min$^{-1}$,
the substitution count M is in the range of $1.0 \times 10^{-5}$ min$^{-1}$ to 1.0 min$^{-1}$,
the linear speed u is in the range of 5.00 m/min to 200.00 m/min,
the mixing rate v is in the range of $1.00 \times 10^{-7}$ m$^3$/min to $1.00 \times 10^{-2}$ m$^3$/min, and
the rotational speed R is in the range of 30 min$^{-1}$ to 1000 min$^{-1}$.

2. The production method according to claim 1, wherein a concentration of the at least one tetravalent metal element salt in the first liquid is 0.01 mol/L or greater.

3. The production method according to claim 1, wherein an alkaline concentration of the second liquid is not greater than 15.0 mol/L.

4. The production method according to claim 1, wherein a pH of the liquid mixture, after mixing the first liquid and the second liquid, is 2.0 to 7.0.

5. The production method according to claim 1, wherein the tetravalent metal element of the at least one tetravalent metal element salt is tetravalent cerium.

6. A production method for a slurry, wherein abrasive grains obtained by the production method according to claim 1 are mixed with water to obtain a slurry.

7. A production method for a polishing liquid, wherein a slurry obtained by the production method according to claim 6 is mixed with an additive to obtain a polishing liquid.

8. A production method for a polishing liquid, wherein abrasive grains obtained by the production method according to claim 1, an additive and water are mixed to obtain a polishing liquid.

9. A production method for a slurry, wherein abrasive grains obtained by the production method according to claim 5 are mixed with water to obtain a slurry.

10. A production method for a polishing liquid, wherein a slurry obtained by the production method according to claim 9 is mixed with an additive to obtain a polishing liquid.

11. A production method for a polishing liquid, wherein abrasive grains obtained by the production method according to claim 5, an additive and water are mixed to obtain a polishing liquid.

12. The production method according to claim 1, wherein the temperature T is in the range of 0° C. to 60° C.

13. The production method for abrasive grains according to claim 1, wherein said first liquid is an aqueous solution of a tetravalent metal element salt, and said second liquid is a solution of an alkali.

14. The production method for abrasive grains according to claim 1, wherein the mixing is conducted so as to react the at least one tetravalent metal element salt with the at least one alkali to obtain the tetravalent metal element hydroxide.

15. The production method according to claim 12, wherein the liquid volume Q is 0.001 to 10.00 m$^3$, and the radius of rotation r of the stirring blade is in the range of 0.001 m to 10 m.

16. The production method according to claim 15, wherein the area S of the stirring blade is 0.0005 to 0.0340 m.

17. The production method according to claim 1, wherein the mean particle size of the abrasive grains formed is 1-200 nm.

18. The production method according to claim 1, wherein ΔpH is in the range of 0.001 to 1.00.

19. The production method according to claim 1, wherein the tetravalent metal element is cerium, and the alkali is selected from the group consisting of ammonia and imidazole.

\* \* \* \* \*